United States Patent
El-Siblani et al.

(10) Patent No.: US 10,737,437 B2
(45) Date of Patent: Aug. 11, 2020

(54) METHOD OF COMPENSATING FOR INHIBITOR PERMEABLE FILM DEFORMATION IN THE MANUFACTURE OF THREE-DIMENSIONAL OBJECTS

(71) Applicant: Global Filtration Systems, Dearborn Heights, MI (US)

(72) Inventors: Ali El-Siblani, Dearborn Heights, MI (US); Mohamad Janbain, Oberhausen (DE); Alexander Nam, Bottrop (DE)

(73) Assignee: Global Filtration Systems, Dearborn Heights, MI (US)

( * ) Notice: Subject to any disclaimer, the term of this patent is extended or adjusted under 35 U.S.C. 154(b) by 287 days.

(21) Appl. No.: 15/947,079

(22) Filed: Apr. 6, 2018

(65) Prior Publication Data
US 2018/0290373 A1   Oct. 11, 2018

Related U.S. Application Data

(60) Provisional application No. 62/482,934, filed on Apr. 7, 2017.

(51) Int. Cl.
| | |
|---|---|
| *G06F 17/17* | (2006.01) |
| *B29C 64/106* | (2017.01) |
| *B29C 64/393* | (2017.01) |
| *B29C 64/336* | (2017.01) |
| *G03F 7/00* | (2006.01) |
| *B29C 64/124* | (2017.01) |
| *B33Y 50/02* | (2015.01) |
| *B33Y 10/00* | (2015.01) |

(52) U.S. Cl.
CPC .......... *B29C 64/106* (2017.08); *B29C 64/124* (2017.08); *B29C 64/336* (2017.08); *B29C 64/393* (2017.08); *G03F 7/0037* (2013.01); *B33Y 10/00* (2014.12); *B33Y 50/02* (2014.12)

(58) Field of Classification Search
CPC ... B29C 64/124; B29C 64/129; B29C 64/135; B29C 64/386; B29C 64/393; B33Y 10/00; B33Y 50/00; B33Y 50/02; G06F 17/17
USPC ................................ 264/40.1, 401; 708/290
See application file for complete search history.

(56) References Cited

U.S. PATENT DOCUMENTS

| | | |
|---|---|---|
| 5,122,441 A | 6/1992 | Lawton et al. |
| 2010/0262272 A1 | 10/2010 | Shkolnik et al. |
| 2014/0306380 A1 | 10/2014 | El-Siblani et al. |

(Continued)

OTHER PUBLICATIONS

International Search Report and Written Opinion for PCT/US2018/026494 dated Jun. 8, 2018.

*Primary Examiner* — Leo B Tentoni
(74) *Attorney, Agent, or Firm* — Hansen IP Law PLLC

(57) ABSTRACT

A method and apparatus for making a three-dimensional object by solidifying a photohardenable material are shown and described. A photohardening inhibitor is admitted into a surface of a photohardenable material through a flexible film to create a "dead zone" where little or no solidification occurs. The dead zone prevents the exposed surface of the photohardenable material from solidifying in contact with the film. The inhibitor causes the film to deform along the build axis, thereby creating a non-planar interface between the photohardednable material and the film. A method is provided to compensate the three-dimensional object data based on the deformation of the film.

35 Claims, 18 Drawing Sheets

(56) References Cited

U.S. PATENT DOCUMENTS

2015/0072293 A1* 3/2015 DeSimone ............ B29C 64/129
  430/322
2016/0046075 A1 2/2016 DeSimone et al.

* cited by examiner

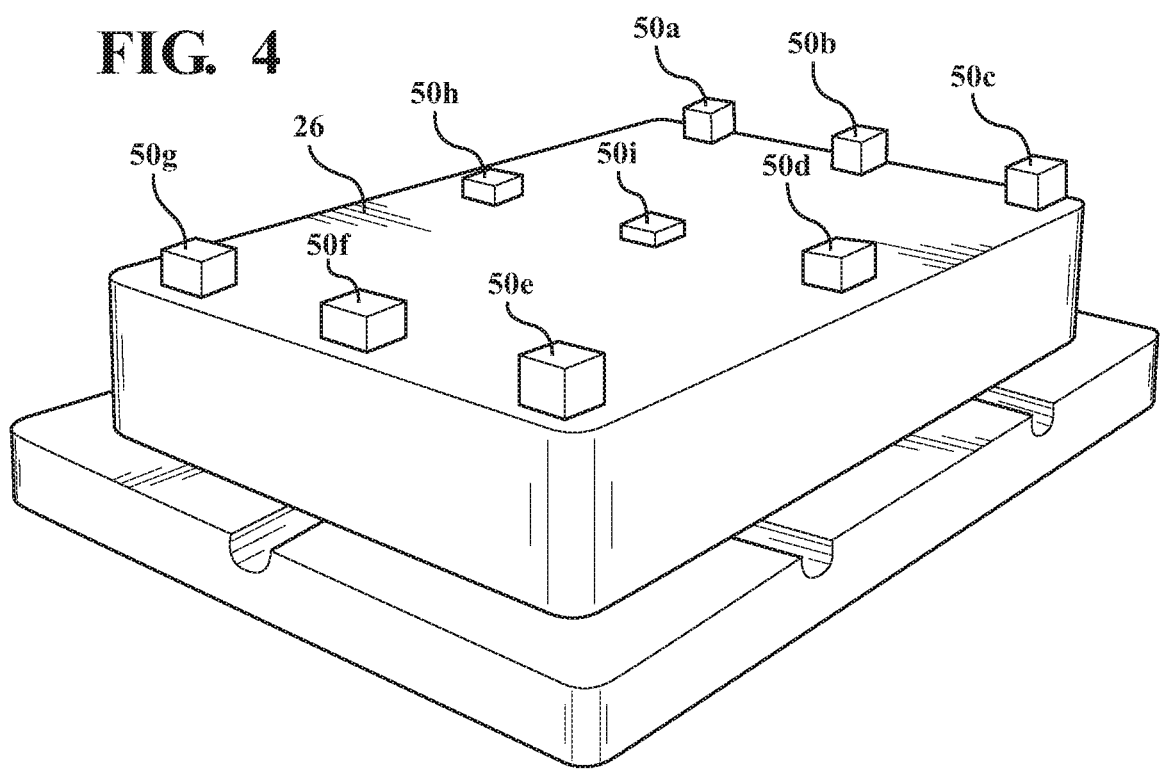
FIG. 4
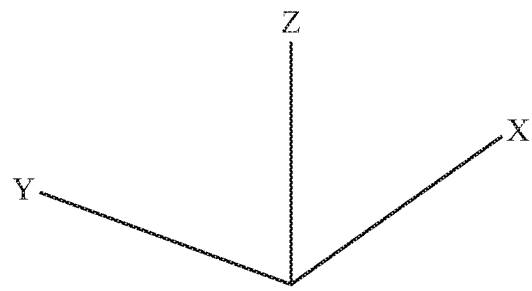

US 10,737,437 B2

METHOD OF COMPENSATING FOR INHIBITOR PERMEABLE FILM DEFORMATION IN THE MANUFACTURE OF THREE-DIMENSIONAL OBJECTS

CROSS-REFERENCE TO RELATED APPLICATIONS

This application claims the benefit of U.S. Provisional Patent Application No. 62/482,934, filed on Apr. 7, 2017, the entire contents of which are hereby incorporated by reference.

FIELD

The disclosure relates to a system and method for manufacturing three-dimensional objects, and more specifically, to a system and method in which a film that is permeable to a photohardening inhibitor deforms, producing a distortion in the planarity of the photohardenable material/film interface.

DESCRIPTION OF THE RELATED ART

Three-dimensional rapid prototyping and manufacturing allows for quick and accurate production of components at high accuracy. Machining steps may be reduced or eliminated using such techniques and certain components may be functionally equivalent to their regular production counterparts depending on the materials used for production.

The components produced may range in size from small to large parts. The manufacture of parts may be based on various technologies including photo-polymer hardening using light or laser curing methods. Secondary curing may take place with exposure to, for example, ultraviolet (UV) light. A process to convert a computer aided design (CAD) data to a data model suitable for rapid manufacturing may be used to produce data suitable for constructing the component. Then, a pattern generator may be used to construct the part. An example of a pattern generator may include the use of DLP (Digital Light Processing technology) from Texas Instruments®, SXRD™ (Silicon X-tal Reflective Display), LCD (Liquid Crystal Display), LCOS (Liquid Crystal on Silicon), DMD (digital mirror device), J-ILA from JVC, SLM (Spatial light modulator) or any type of selective light modulation system.

In certain three-dimensional object manufacturing processes, it is important to ensure that the solidifiable material (e.g., polymeric resin) used to make the object forms a smooth and substantially planar surface to which solidification energy from a pattern generator will be applied. One technique uses an "upside down" build process in which an object is built progressively in the downward build (z) axis direction (toward the earth) as the build platform is progressively elevated in the upward build (z) axis direction. A basin holding the solidifiable material, such as a photohardenable material, has a transparent bottom through which patterns of solidification energy are projected to solidify the photohardenable material in patterns corresponding to cross-sections of the three-dimensional object. However, because the solidification energy is incident at the bottom of the basin, photohardenable material solidifies in contact with the basin and must be separated without damaging the object.

Certain known methods involve the creation of a "dead zone"—where no solidification occurs—in a thin region at the interface between the photohardenable material and a photohardening inhibitor-permeable film that defines the bottom of the basin. These methods avoid the need for a means to separate the solidified object from the bottom of the basin. The methods typically involve feeding a photohardening inhibitor through the film. The inhibitor typically reacts with or consumes a polymerization initiator such that polymerization cannot occur within the dead region. The inhibitor is fed at a rate that affects the thickness of the dead zone. Because no separation step is required, some of the methods move the build platform continuously upward along the build axis to accelerate the build process. However, in some cases, the influx of the inhibitor deforms the inhibitor-permeable film, which disrupts the planarity of the interface between the film and the photohardening material. The data used to drive the photohardening process is generated based on a planar interface. The distortion of the film planarity may cause inaccuracies in the resulting objects relative to the data that defines them. Thus, a need has arisen for a system and method of making three-dimensional objects which addresses the foregoing issues.

BRIEF DESCRIPTION OF THE DRAWINGS

The disclosure will now be described, by way of example, with reference to the accompanying drawings, in which:

FIG. 4 is a perspective view of a build platform with nine (9) test objects used to determine the height of the deformed inhibitor permeable film along the build (z) axis as a function of position in the x, y plane;

DETAILED DESCRIPTION

Figure 1A:
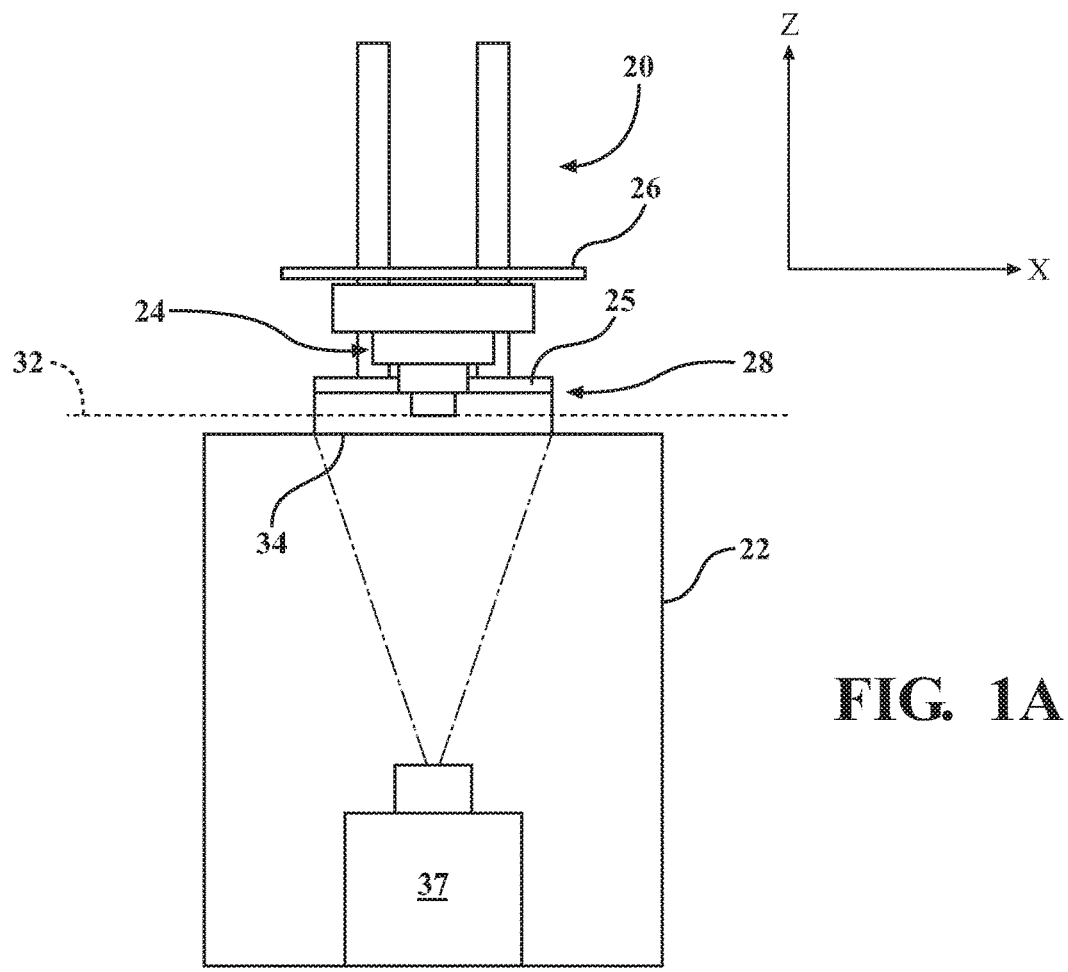
FIG. 1A is a side elevational, cross-sectional view of system for making a three-dimensional object from a solidifiable material in accordance with the present disclosure.

The Figures illustrate examples of a system and method for manufacturing. Based on the foregoing, it is to be generally understood that the nomenclature used herein is simply for convenience and the terms used to describe the invention should be given the broadest meaning by one of ordinary skill in the art.

The system and methods described herein are generally applicable to additive manufacturing of three-dimensional objects, such as components or parts (discussed herein generally as objects), but may be used beyond that scope for alternative applications. The system and methods generally involve creating a "dead zone" of non-solidification in a photohardenable material to prevent the material from solidifying against a surface of a photohardenable material container. The dead zone is created by using a photohardening inhibitor permeable film that defines the surface of the photohardenable material upon which the photohardening energy is incident. The inhibitor reacts with a photoinitiator upon entering the volume of photohardenable material at its interface with the inhibitor permeable film and prevents photohardening in a region proximate the film. That region is the dead zone. Exemplary photoninhibitors suitable for certain photohardenable liquids or resins described herein include air and oxygen. As the air and oxygen are fed through the inhibitor permeable film, the film tends to deform in the direction of inhibitor flow, causing the film to assume a shape that is similar to a dome. This deformation creates a non-planar interface between the photohardening material and the film which can cause the resulting three-dimensional objects to deviate from the computer data that originally defined them.

In accordance with a first aspect of the present disclosure, a method of making a three-dimensional object on a build platform that moves along a build axis is provided. The three-dimensional object is defined by object data corresponding to the three-dimensional object, and the method comprises: (a) admitting a photohardening inhibitor through a flexible film and into a volume of a photohardenable material such that the flexible film deforms; (b) modifying the three-dimensional object data to compensate for the deformation of the flexible film; and (c) projecting photohardening energy through the flexible film and into the photohardenable material in accordance with the modified three-dimensional object data.

In accordance with another aspect of the present disclosure, a method of approximating a deformed shape of a flexible film that selectively permits the passage of photohardening inhibitor from a first side of the film to a second side of the film is provided. The second side of the film is in contact with a volume of a photohardenable material, and the method comprises: providing test object data sets for a plurality of test objects located at different positions in a first plane; projecting photohardening energy through the flexible film and into the photohardenable material to solidify a plurality of test objects, each test object corresponding to one of the test object data sets and having a height along a build axis perpendicular to the plane; measuring a height of each test object along the build axis, wherein each height corresponds to a position in the plane; and determining a function relating a height of the deformed film along the build axis to a position in the plane from the measured object heights and corresponding positions in the plane.

In accordance with yet another aspect of the present disclosure, a method of modifying three-dimensional object layer data sets to account for the deformation of a flexible film that retains a volume of photohardenable material that is hardened to form a three-dimensional object along a build axis is provided, wherein each object layer data set corresponds to a location along the build axis, and the method comprises: generating a plurality of flexible film data subsets from a data representation of the flexible film, wherein each flexible film data subset corresponds to a location along the build axis; generating a modified object layer data set for each layer based on the corresponding object layer data set for the layer and each of the flexible film data subsets in a plurality of flexible film data subsets, wherein each flexible film data subset corresponds to a location along the build axis.

The system is generally used for manufacturing three-dimensional objects from a solidifiable material and rapid prototyping. A pattern generator (such as a digital light projector, laser, LCD, LED array, etc.) provides an image to the solidifiable material to selectively solidify it.

As discussed herein, a solidifiable material is a material that when subjected to energy, wholly or partially hardens. This reaction to solidification or partial solidification may be used as the basis for constructing the three-dimensional object. Examples of a solidifiable material may include a polymerizable or cross-linkable material, a photopolymer, a photo powder, a photo paste, or a photosensitive composite that contains any kind of ceramic based powder such as aluminum oxide or zirconium oxide or ytteria stabilized zirconium oxide, a curable silicone composition, silica based nano-particles or nano-composites. The solidifiable material may further include fillers. Moreover, the solidifiable material may take on a final form (e.g., after exposure to the electromagnetic radiation) that may vary from semi-solids, solids, waxes, and crystalline solids. A photohardenable material is a material that—when subjected to electromagnetic energy of a particular intensity and for a particular duration—hardens through polymerization and/or cross-linking (curing)

When discussing a photopolymerizable, photocurable, or solidifiable material, any material is meant, possibly comprising a resin and optionally further components, which is solidifiable by means of supply of stimulating energy such as electromagnetic radiation. Suitably, a material that is polymerizable and/or cross-linkable (i.e., curable) by electromagnetic radiation (common wavelengths in use today include UV radiation and/or visible light) can be used as such material. In an example, a material comprising a resin formed from at least one ethylenically unsaturated compound (including but not limited to (meth)acrylate monomers and polymers) and/or at least one epoxy group-containing compound may be used. Suitable other components of the solidifiable material include, for example, inorganic and/or organic fillers, coloring substances, viscose-controlling agents, etc., but are not limited thereto.

When photopolymers are used as the solidifiable material, a photoinitiator is typically provided. The photoinitiator absorbs light and generates free radicals which start the polymerization and/or crosslinking process. Suitable types of photoinitiators include metallocenes, 1, 2 di-ketones, acylphosphine oxides, benzyldimethyl-ketals, α-amino ketones, and α-hydroxy ketones. Examples of suitable metallocenes include Bis (eta 5-2, 4-cyclopenadien-1-yl) Bis [2,6-difluoro-3-(1H-pyrrol-1-yl) phenyl] titanium, such as Irgacure 784, which is supplied by Ciba Specialty chemicals. Examples of suitable 1,2 di-ketones include quinones such as camphorquinone. Examples of suitable acylphosphine oxides include bis acyl phosphine oxide (BAPO), which is supplied under the name Irgacure 819, and mono acyl phosphine oxide (MAPO) which is supplied under the name Darocur® TPO. Both Irgacure 819 and Darocur® TPO are supplied by Ciba Specialty Chemicals. Examples of suitable benzyldimethyl ketals include alpha, alpha-dimethoxy-alpha-phenylacetophenone, which is supplied under the name Irgacure 651. Suitable α-amino ketones include 2-benzyl-2-(dimethylamino)-1-[4-(4-morpholinyl) phenyl]-1-butanone, which is supplied under the name Irgacure 369. Suitable α-hydroxy ketones include 1-hydroxy-cyclohexyl-phenyl-ketone, which is supplied under the name Irgacure 184 and a 50-50 (by weight) mixture of 1-hydroxy-cyclohexyl-phenyl-ketone and benzophenone, which is supplied under the name Irgacure 500.

The pattern generator(s) may be configured in a number of ways. Many may provide controlled electromagnetic radiation to provide a desired pattern. The electromagnetic radiation may include actinic light, visible or invisible light, UV-radiation, IR-radiation, electron beam radiation, X-ray radiation, laser radiation, or the like. Moreover, while each type of electromagnetic radiation in the electromagnetic spectrum may be discussed generally, the disclosure is not limited to the specific examples provided. Those of skill in the art are aware that variations on the type of electromagnetic radiation and the methods of generating the electromagnetic radiation may be determined based on the needs of the application.

Referring to FIG. 1A, a system 20 for making a three-dimensional object 24 from a photohardenable material 25 is depicted. System 20 is generally configured to receive data describing the shape and appearance of the object (such as CAD data) and to create a solid object 24 in conformity with the data. System 20 includes a housing 22 in which a pattern generator 37 is disposed. Pattern generator 37 projects two-dimensional solidification energy images upward along a build (z) axis and through an opening 34 in the top of housing 22. Photohardenable material 25 is a material that when subjected to electromagnetic energy of a particular intensity and for a particular duration hardens through polymerization and/or cross-linking (curing). Each image projected by pattern generator 37 corresponds to a cross-section of three-dimensional object 24. The photohardenable material 25 is held in a container 28 with a transparent bottom. The container 28 is positioned over opening 34 in the top of housing 22 so that electromagnetic energy (such as UV, IR or visible light) can enter the container 28. At least one process computer is operatively connected to the pattern generator 37 and a build platform actuator (not shown) to provide image data to the pattern generator 37 to move the build platform 26 along the build (z) axis. One of the process computers or another computer may be provided to convert image data from one format (e.g., .stl files) to another suitable for use by the pattern generator (e.g., bitmaps).

Solidification of the photohardenable material 25 occurs in a building region that begins at a build plane 32. Build plane 32 is defined by a dead zone 41 (FIG. 2) which is a region into which solidification energy penetrates but in which the photohardenable material 25 does not harden. In certain examples, the dead zone 41 is created by feeding a photohardening inhibitor 47 into the container 28 or a portion thereof which holds the photohardenable material 25. In the same or other cases, the temperature of the dead zone 41 is controlled to inhibit polymerization.

Figure 2:
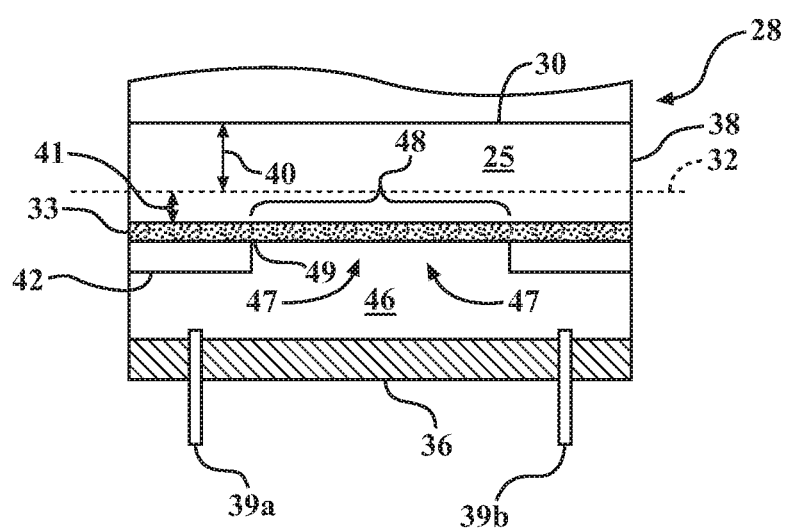
FIG. 2 is a close-up cross-sectional view of a first example of a photohardenable material basin for use in the system of FIG. 1A.

The container 28 may be structured in a number of different ways. One exemplary configuration is shown in FIG. 2. Container 28 includes a transparent bottom 36 comprising a rigid or semi-rigid material such as a glass or plastic. Inhibitor permeable film 33 defines a transparent surface that is permeable to the photohardening inhibitor and is spaced apart from the bottom 36 along the build (z) axis. The photohardenable material 25 is above and in contact with inhibitor permeable film 33. The inhibitor permeable film 33 is attached to the sides of frame 38 which defines the side walls of the container 28. Film 33 sits on a central flange 49 that defines a central opening 48 (FIG. 2). Flange 49 projects upward from shelf 42. A chamber 46 is defined between film 33 and transparent bottom 36. The chamber 46 acts as a reservoir of the photohardening inhibitor 47 and has an internal pressure that may be regulated by the flow of inhibitor 47 into the container and/or the speed of movement of the build platform 26 away from the build plane 32. Inhibitor inlets 39a and 39b are connected to a source of the inhibitor 47. The inhibitor 47 is preferably selected to be reactive with and consume a polymerization initiator in photohardenable material 25. Exemplary inhibitors 47 include oxygen and air. The inhibitor enters chamber 46 through inlets 39a and 39b and permeates inhibitor permeable film 33 through central opening 48 to contact the exposed (lower) surface 27 of photohardenable material 25 which is in contact with film 33. The flowrate of the inhibitor 47 entering ports 39a and 39b is preferably selected to maintain a desired dead zone 41 thickness along the build (z) axis. As shown in FIG. 2, build plane 32 is spaced apart from inhibitor permeable film 33 along the build (z) axis by a distance that defines the thickness of dead zone 41. When solidification energy is projected from pattern generator 37, solidification begins at the build plane 32 and does not occur in dead zone 41.

The immersion depth 40 is the build (z) axis thickness between the upward facing, exposed surface 30 of the photohardenable material and the build plane 32. The immersion depth 40 is the depth to which the most recently formed, downward-facing surface of object 24 is immersed in the unsolidified, photohardenable material 25. In other examples, the displacement of the film 33 is controlled by adjusting the upward speed of movement of the build platform 26 along the build (z) axis. In further examples, the flow rate or pressure of the inhibitor 47 on one hand and the build platform 26 speed on the other hand are used to control the displacement of the center point C of film 33. For example, a split range control system may be used in which the inhibitor pressure in the chamber 46 (FIGS. 1B, 1C, and 2) is adjusted to control the film displacement until it reaches a high limit, and then the build platform 26 speed may be adjusted to control the film 33 displacement as needed once the inhibitor pressure limit is reached.

Figure 1B:
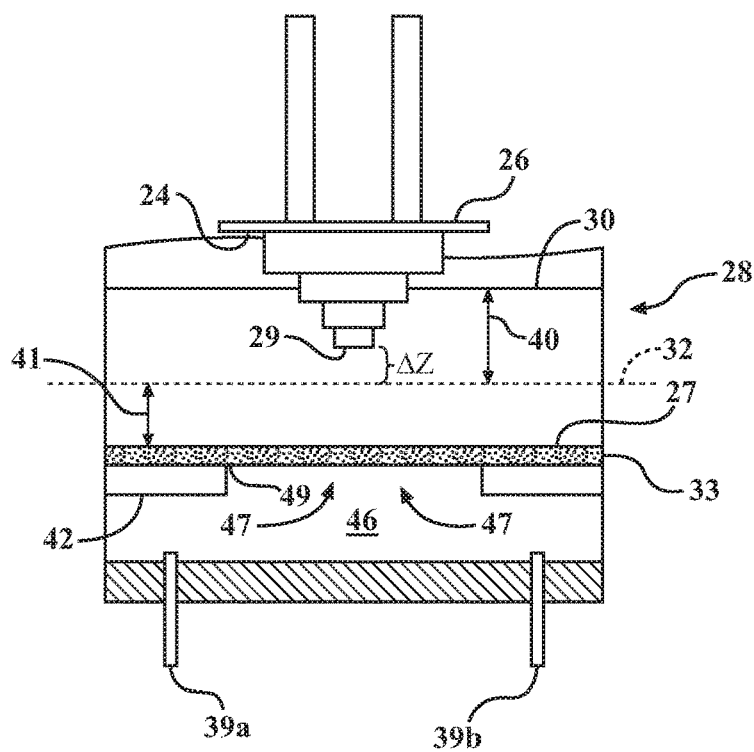
FIG. 1B is a close-up, side-elevational, cross-sectional view of a build platform and photohardenable material container in a first configuration prior to the solidification of a layer of photohardenable material.
Figure 1C:
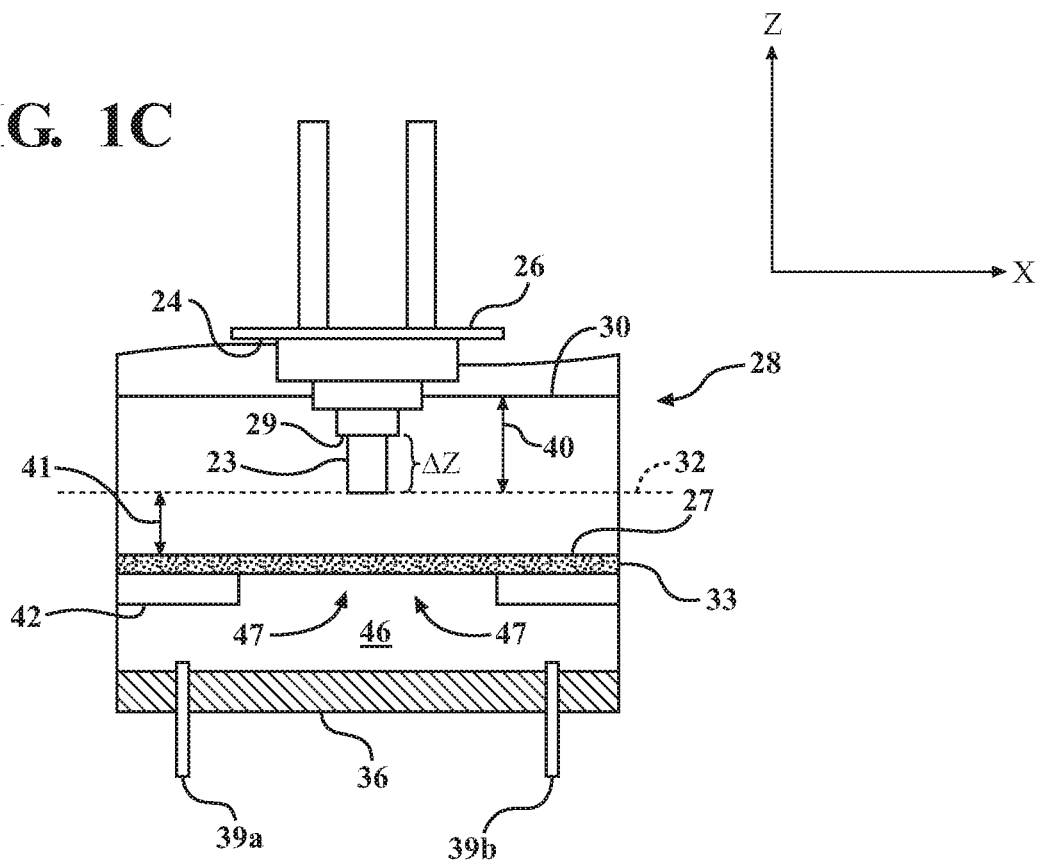
FIG. 1C is a close-up, side-elevational, cross-sectional view of a build platform and photohardenable material container in a second configuration following the solidification of a layer of photohardenable material.
Figure 3A:
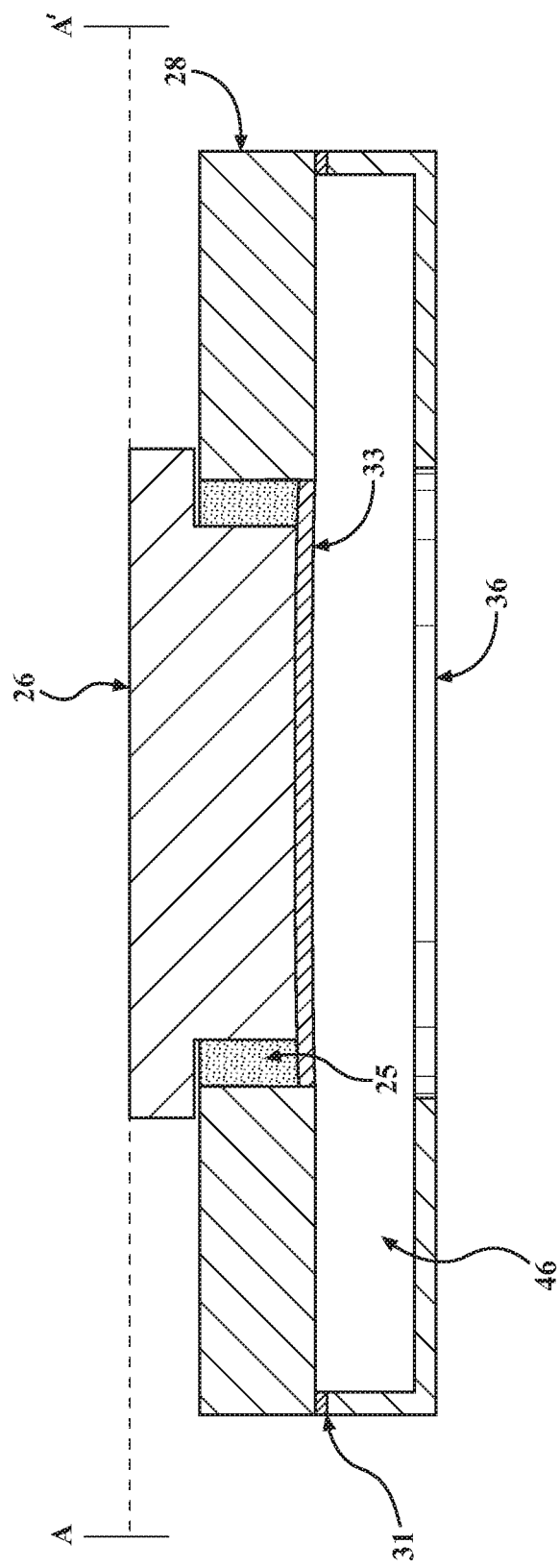
FIG. 3A is partial, close-up, side elevational view of a build platform (without the elevator assembly) and a photohardenable material container in a first configuration with the build platform engaging a deformable, flexible film that separates the photohardenable material from a source of a photohardening inhibitor wherein the film is in a substantially planar configuration.
Figure 3B:
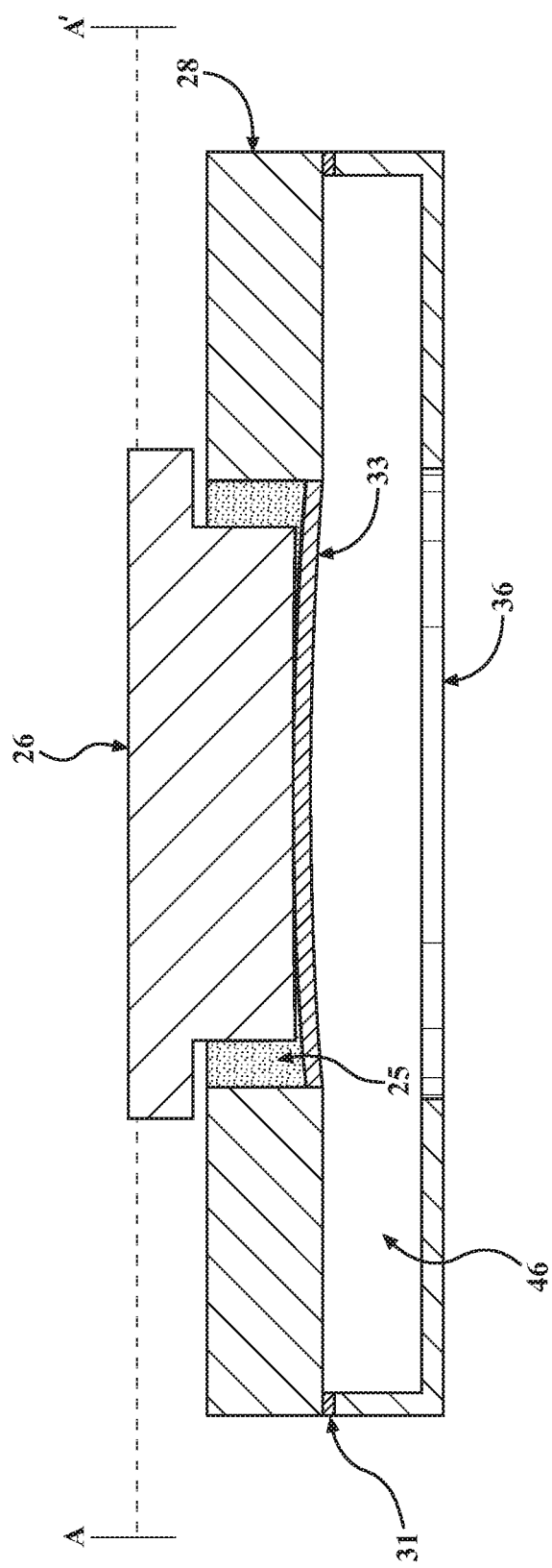
FIG. 3B is the build platform and photohardenable material container of 3A in a second configuration along the build axis with the film in a slightly deformed, domed configuration and in contact with the film.
Figure 3C:
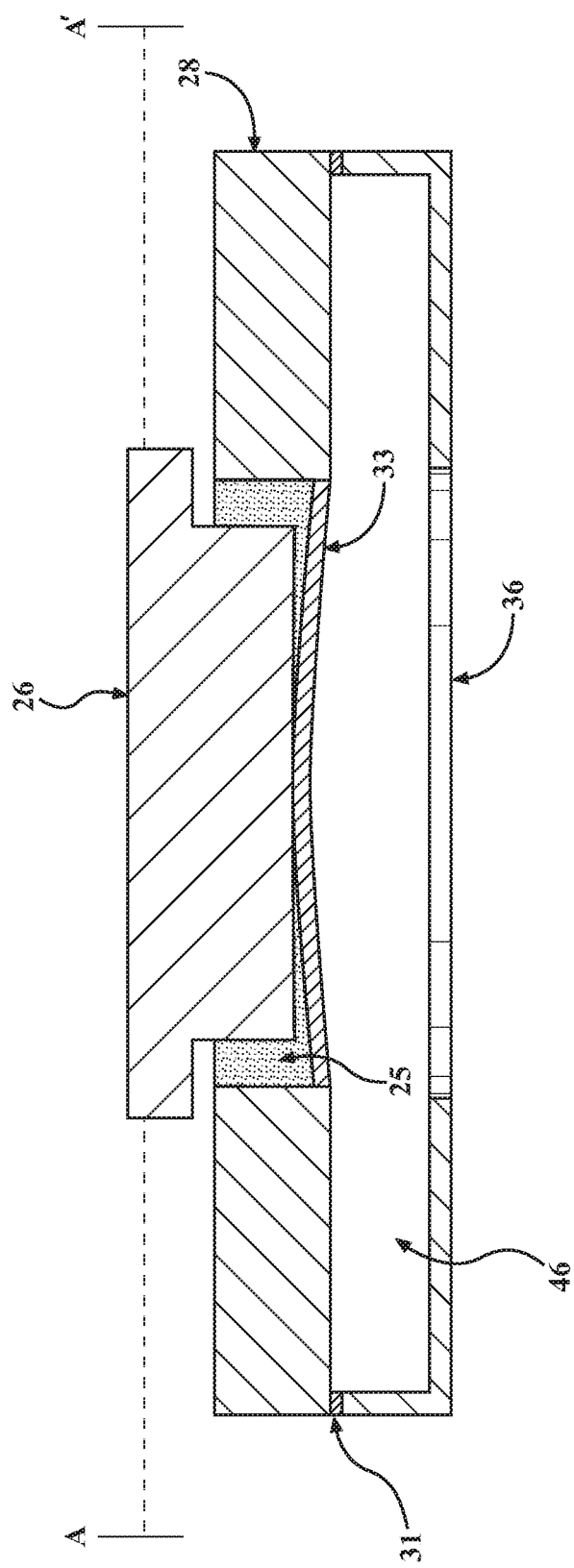
FIG. 3C is the build platform and photohardenable material container of 3A in a third configuration along the build axis with the film in a somewhat more deformed, domed configuration and in contact with the film.
Figure 3D:
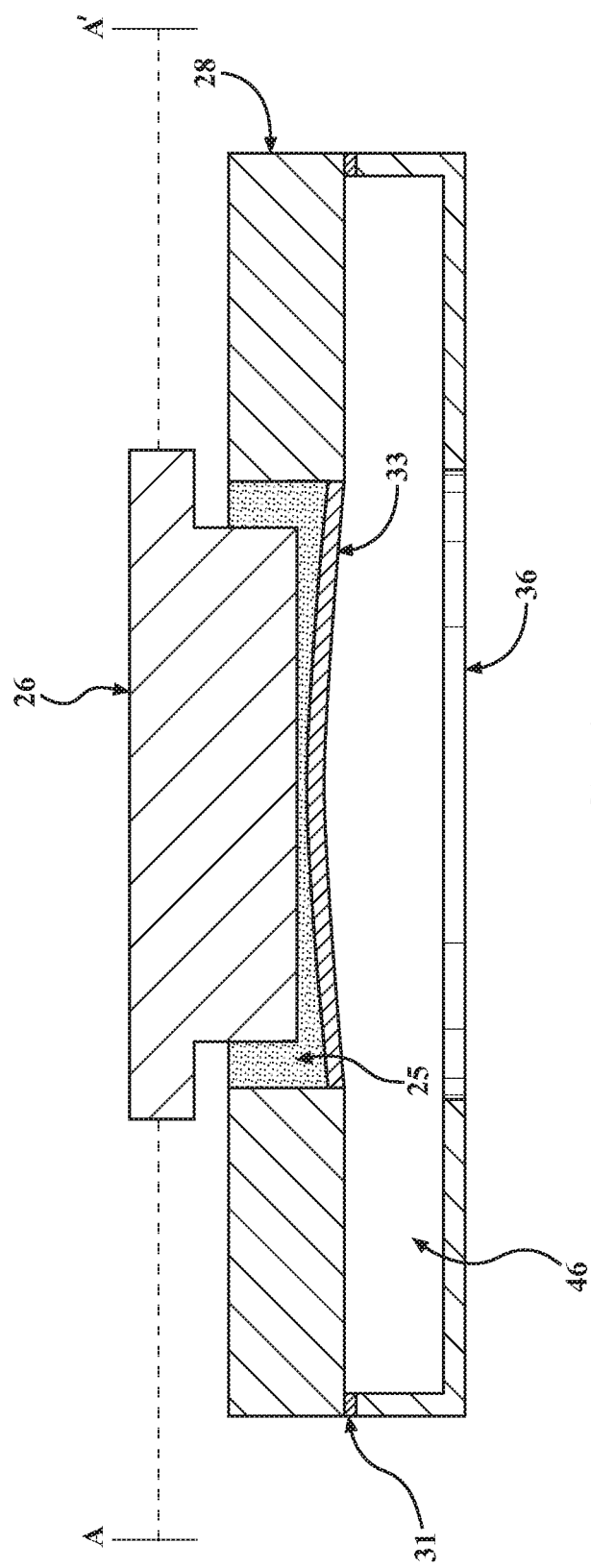
FIG. 3D is the build platform and photohardenable material container of 3A in a fourth configuration along the build axis with the film in a fully deformed, domed configuration and spaced apart from the film along the build (z) axis.

FIGS. 3A-3D show a simplified depiction of container 28. The oxygen inlet ports are not shown but would be present as shown in FIGS. 1B, 1C, and 2. The build platform 26 elevator assembly is also not shown. FIGS. 3A-3D show the deformable film 33 and build platform 26 in a variety of positions during the initial part of an object build process. Reference line A-A' is provided to indicate the relative positions of the build platform 26 along the build (z) axis in the initial stages of an object build process. At the position of FIG. 3A, the platform 26 is touching film 33 as it shown in FIG. 3A. Then the build process starts. Projector 37 (FIG. 1A) starts projecting images one by one within certain time intervals, at the same time the platform 26 is moving continuously upward along the build (z) axis. This process is depicted in FIGS. 3B-3D. The film 33, which is in contact with the platform 26 at the start position (FIG. 3A), is releasing while platform 26 moves upward along the build (z) axis. At a certain moment, the shape of the film 33 reaches a stable but deformed form, and the film 33 loses direct contact with the platform 26, as is shown in slide 3D. Rubber sealant 31 is provided to seal the chamber 46.

The photohardening process on deformed film 33 creates distortion which replicates the shape of the film 33. This creates distortion through the whole part 24 (FIG. 1A), not only at the end of the part 24. There are three main stages of compensating for film 33 deformation: measuring the deformed film shape, discretization the deformed film shape, and compensating for the film deformation.

Figure 16:
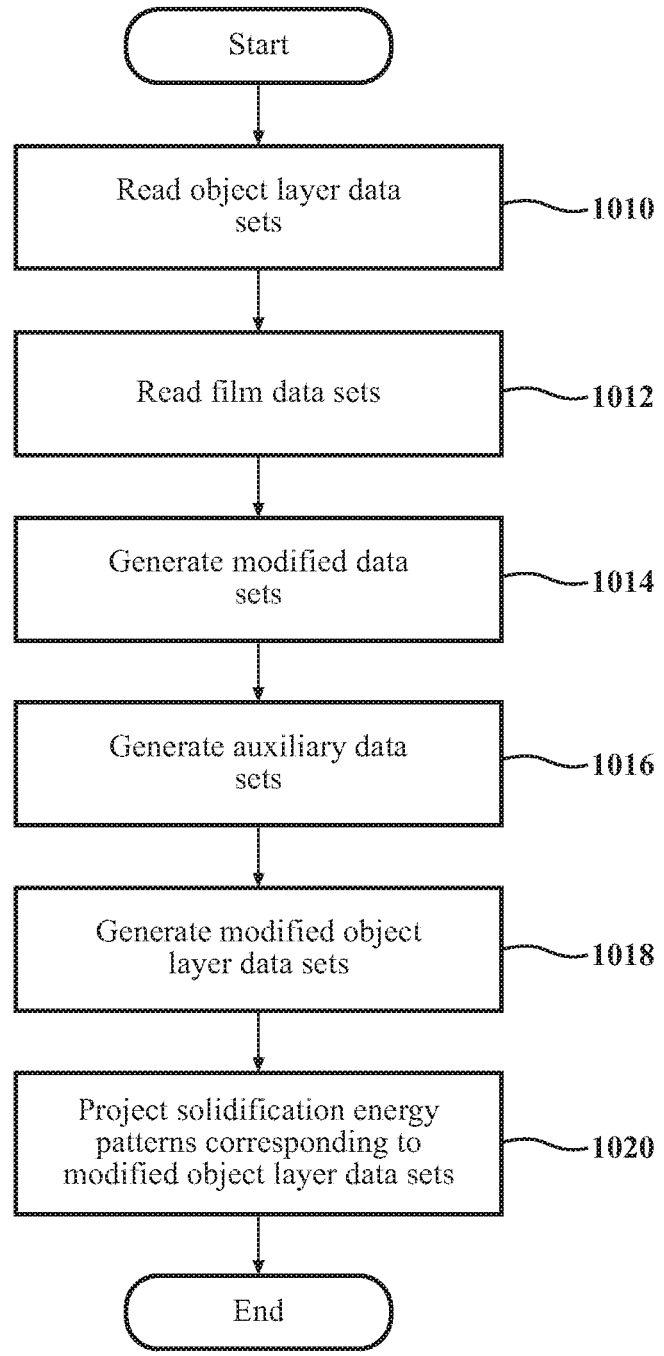
FIG. 16 is a flow chart depicting a method of modifying object data to compensate for the deformation of a flexible photohardening inhibitor-permeable film.

A general method for modifying object data to account for the deformation of film 33 is provided in FIG. 16. As described above, object data may be provided in a variety of formats such as CAD/CAM data, STL data, etc. However, the data is preferably provided as, or subsequently converted to, object layer data sets. An object layer data set is a set of data that defines the cross-section of the object at a particular build (z) axis location corresponding to a particular layer. It may be provided in different formats, including bitmaps and Cartesian coordinates. Thus, in step 1010 object layer data sets are read. The symbol M(j) will be used herein to represent object layer data sets. The object layer index j will have values ranging from 1 to n, where n is the last layer.

Figure 5:
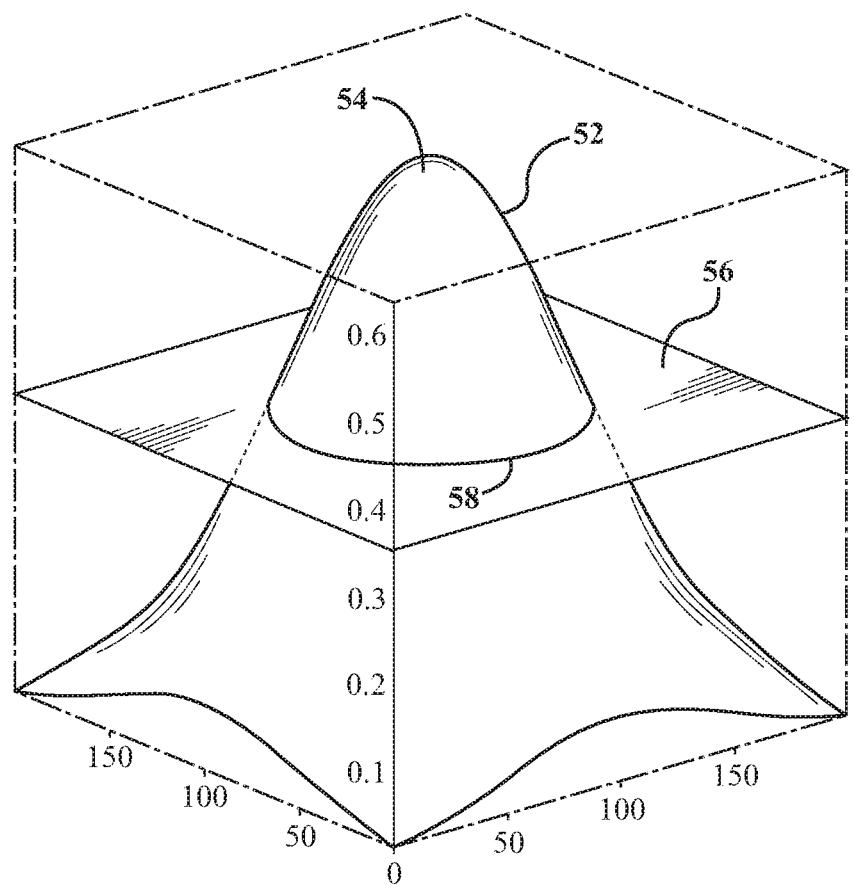
FIG. 5 is an exaggerated view of a mathematical model of the deformable film of FIGS. 1A-B and 3A-3D with a plane perpendicular to the build axis extending therethrough to generate a flexible film data subset at a build (z) axis position of about 0.45 units.
Figure 5:
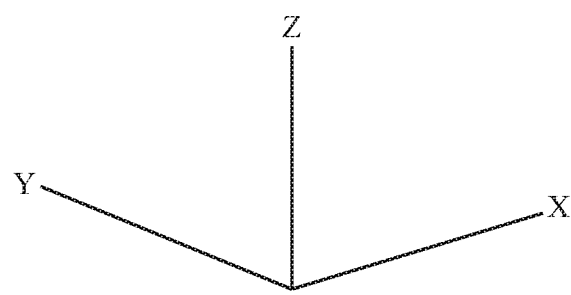
Figure 6:
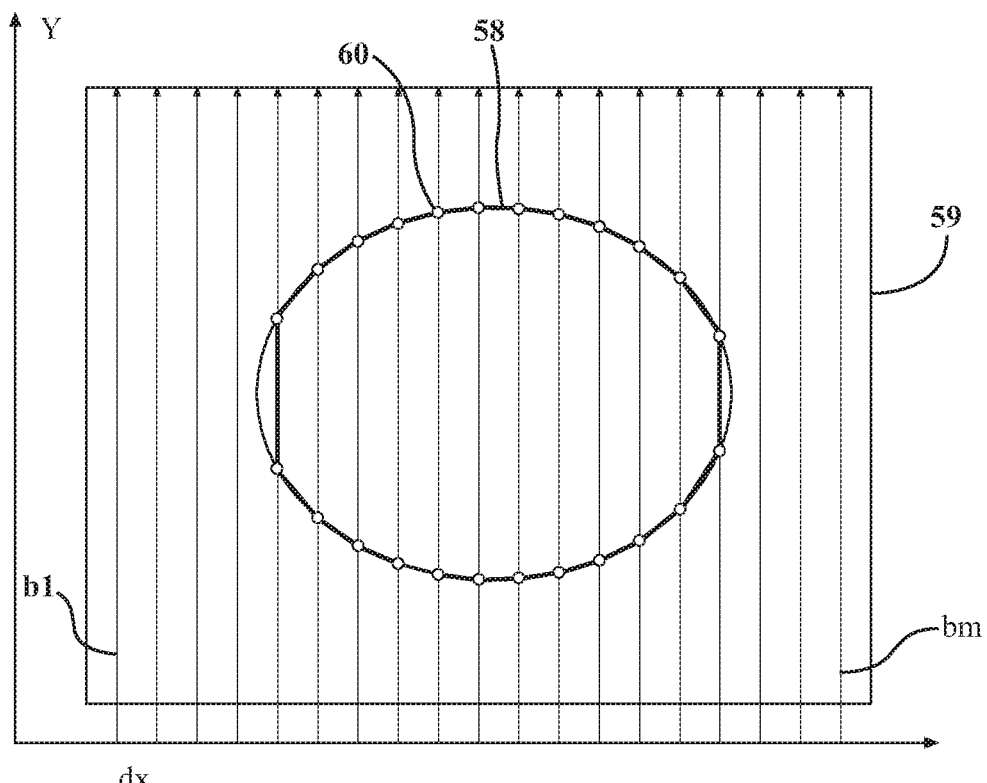
FIG. 6 is a top plan of the plane of FIG. 5 showing the contour defined by the intersection of the plane and the mathematical model of the deformable film with grid lines used to define points of discretization of the contour.
Figure 7:
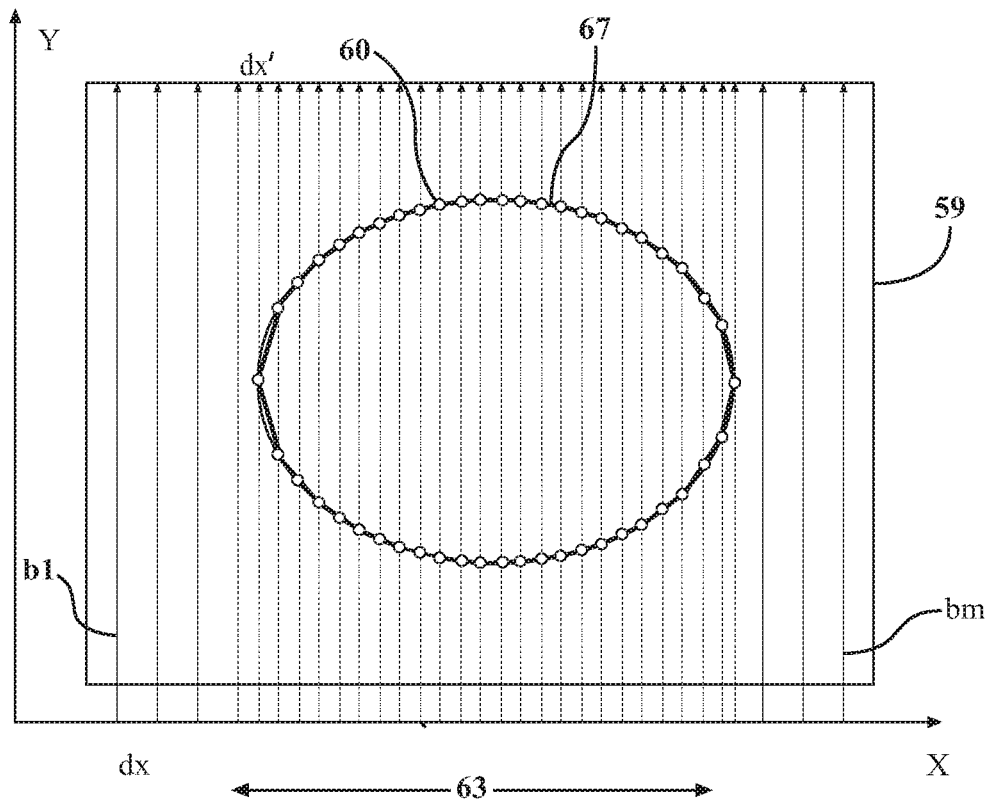
FIG. 7 is a top plan view of the plane of FIG. 6 showing a region of refinement in which the density of discretization points is increased.
Figure 8:
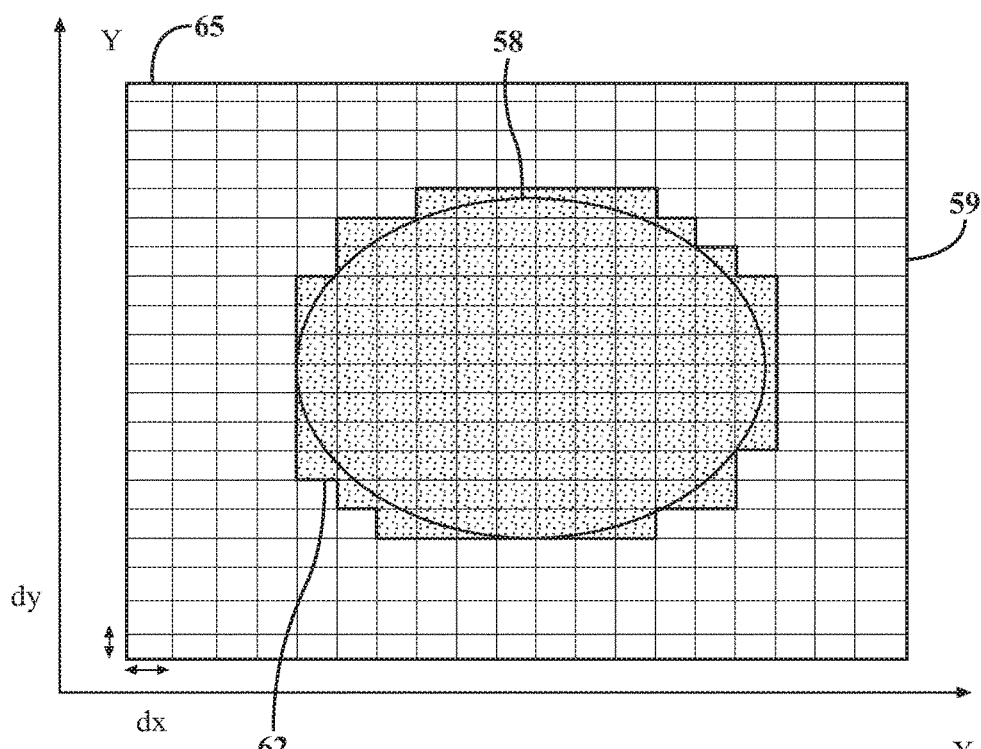
FIG. 8 is a top plan view of the deformable flexible film data subset defined by the intersection of the plane and deformable film of FIG. 5 in the form of a bitmap.

Flexible film data subsets are read in step 1012. Flexible film data subsets sets define the cross-sectional shape of the deformed film 33 for at a particular build (z) axis location, which in turn may correspond to a particular object layer. The flexible film data subsets collectively define a flexible film data set. The data representation of the flexible film 33 in a deformed state may be analytical or mathematical. As explained further below, in one example, flexible film data sets comprise contour data sets, with each set itself comprising subsets (contours) which comprise pairs of Cartesian coordinates. The contour data subsets are represented as C(i), where (i) is a contour index. In another example, flexible film data sets comprise bitmap data sets, each set comprising a plurality of bitmaps. Each bitmap includes pixel numbers and an energy state (ON, OFF, or gray scale) and are represented as B(i), where (i) is a flexible film data index. Examples of a flexible film data subsets are shown in FIGS. 6-8. Each film data subset results from the intersection of one plane with the model of the flexible film. In FIG. 6, a contour 58 resulting from the intersection of a plane 56 (FIG. 5) with deformed flexible film model 52 is shown. The contour 58 is a flexible film data subset and is plotted as a set of Cartesian coordinates on an x-y axis in a region 59 that defines a build envelope in FIG. 6. A build envelope is a region in which photohardenable material may be hardened to form an object. A plurality of points 60 are plotted to "discretize" the contour 58. In FIG. 6, the discretization interval dx is used to discretize contour 58, resulting in the generation of points 60 shown in the figure. In FIG. 7 a refined discretization interval dx' is used wherein dx'<dx. The refined interval increases the accuracy of the discretization process by using points 60 which are only dx' units apart. The generation of flexible film data subsets is repeated using different planes at different positions along the build (z) axis (one such plane 56 is shown in FIG. 5). Each plane generates a new flexible film data subset until the completed set comprises subsets 1 to K, where K corresponds to the peak 54 of the fully deformed flexible film (FIG. 5).

In FIG. 8 a flexible film data subset is plotted as a bitmap comprising pixels 62. Set of pixels 62 consists of the pixels which overlaps contour 58, and the pixels located inside contour 58. In other words, the pixel set 62 is a part of region 59 bounded by a closed contour 58. The pixel sizes are dx and dy as shown in the figure. The bitmap of FIG. 8 is also generated by intersecting a data representation of a plane 56 with a data representation 52 of the flexible film 33. By using different planes at different build axis locations, a bitmap set B(1) . . . B(K) is generated, with each member B(i) comprising a bitmap.

Figure 9:
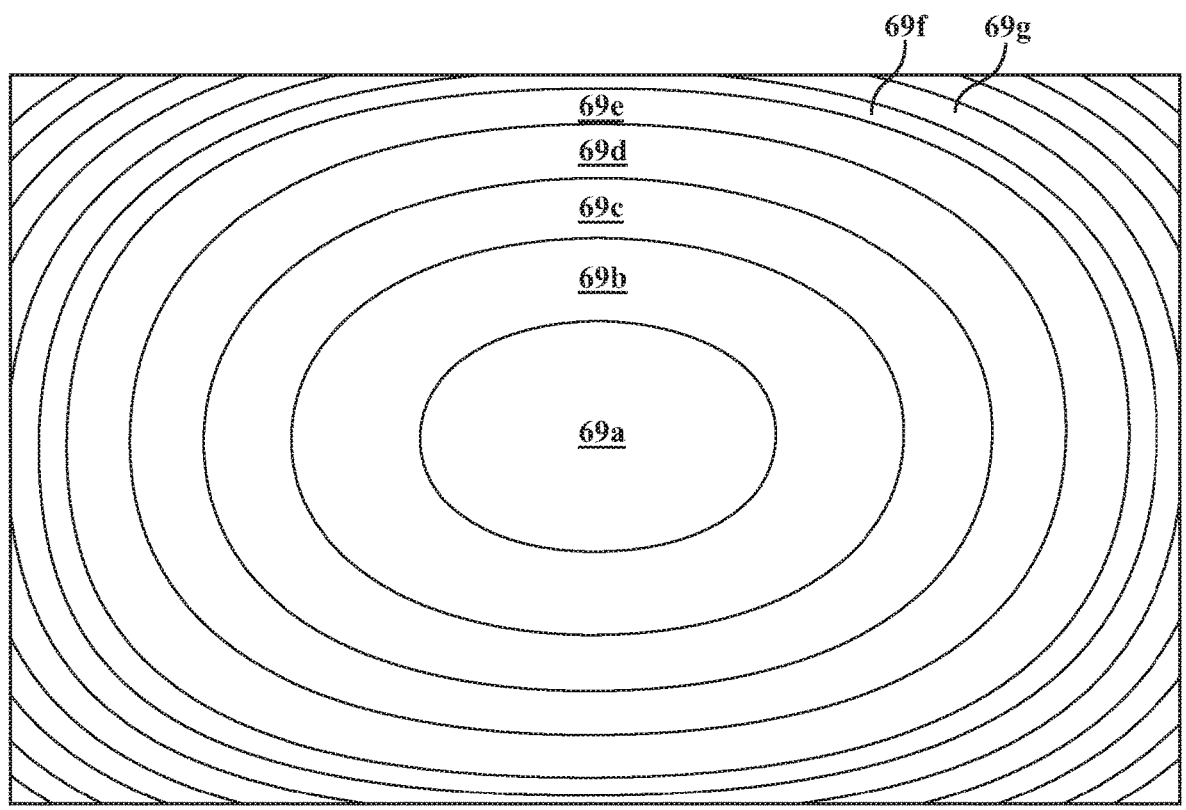
FIG. 9 is a contour map; showing the contours defined the intersections of several planes at different build (z) axis locations with the mathematical model of the deformable film of FIG. 5.

FIG. 9 depicts a flexible film data set comprising subsets 69a to 69g. Each subset may be provided as a contour (C(1) to C(K)) or as a bitmap (B(1) to B(K)).

In certain examples, and as described further below, flexible film data sets are determined by intersecting a deformed film function P(x,y) (FIG. 5) with a series of planes that are perpendicular to the build axis and located at different positions along the build (z) axis. The deformed film function P(x,y) may be determined in a number of ways. In certain examples, test parts are built and height measurements are used to develop a discrete set of coordinates x, y, and z for each point. Interpolation is used to determine the test part heights along the build (z) axis at x, y locations intermediate to those at which the measurements were made.

In step 1014 modified flexible film data subsets are generated. As will be explained in detail below, modified (or updated) flexible film data subsets represent the subtraction of a flexible film data subset from an object layer data set M(j). Aa explained further below, in one example, modified flexible film data subsets may comprise pairs of Cartesian coordinates and may be represented as C'(1) to C'(K) where i is a flexible film data subset index ranging from 1 to K. In another example, modified flexible film data subsets may comprise bitmaps comprising pixel numbers and an energy state (ON, OFF, gray scale) and may be represented as B'(i) where i is the flexible film set data index ranging from 1 to K. The modified flexible film data subset index has values of 1 to K, where K corresponds to the maximum deformed film height at peak 54 (FIG. 5). The subtraction is done on a layer by layer basis. So, each layer j=1 to n has 1 to K modified flexible film data subsets that collectively define a modified flexible film data set for the layer.

Figure 10:
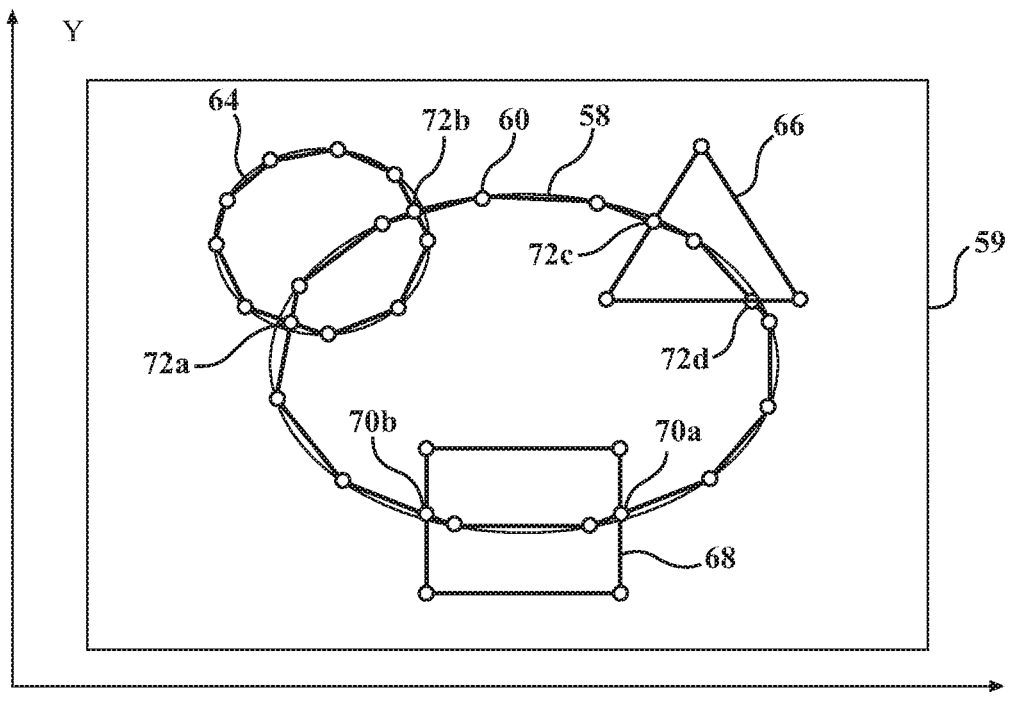
FIG. 10 is a top plan view of a graphical depiction of an object layer data set and a flexible film data subset in the form of Cartesian coordinates used to illustrate the generation of a modified contour data set.
Figure 11:
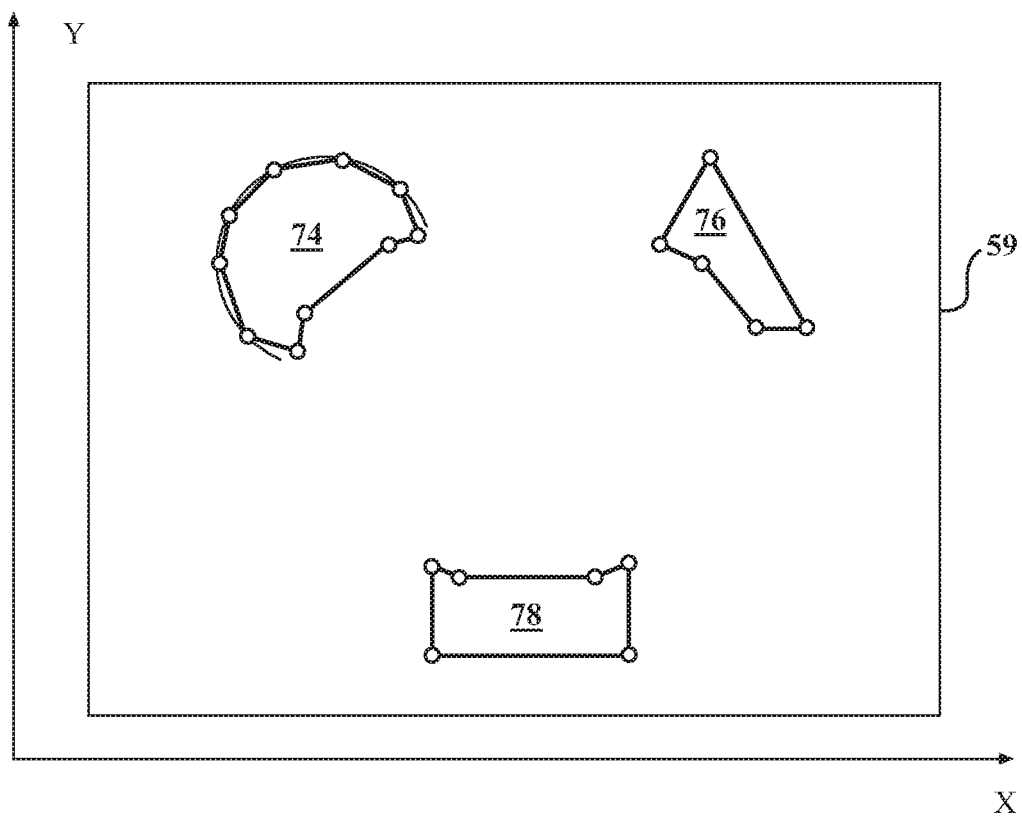
FIG. 11 is a modified contour data subset following the subtraction of the flexible film contour data subset of FIG. 10 from the object layer data set of FIG. 10.

An example of the subtraction used in step 1014 for flexible film data subsets that comprise Cartesian coordinates is shown in FIGS. 10 and 11. The object layer data set M(j) includes three separate objects 64, 66, and 68. Object 64 intersects the contour 58 defined by the flexible film data subset at points 72a and 72b. Object 66 intersects contour 58 at points 72c and 72d. Object 68 intersects contour 58 at points 70a and 70b. The portions of each object 64, 66, and 68 which lie within the contour 58 are removed. However, the portions of contour 58 which connect the points of intersection 72a/72b, 72c/72d, and 70a/70b are retained. The result of the subtraction is shown in FIG. 11, which is the modified flexible film data subset for contour 58 at a specific flexible film data subset index value i. Modified contour subsets 74, 76 and 78 are the result of the subtraction. This process would be repeated for all of the contours 1-K. The number of flexible film data subsets used may vary. However, in one example, a flexible film data set is created for each object layer.

Figure 12:
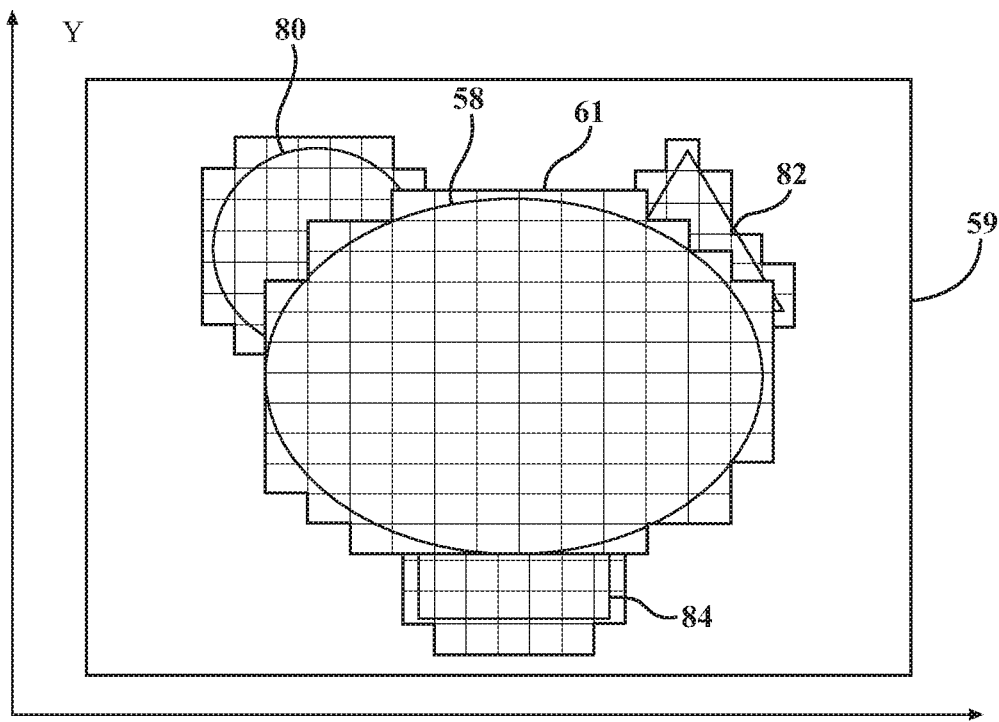
FIG. 12 is a top plan view of a bitmap representation of an object layer data set and a flexible film data subset used to illustrate the generation of a modified flexible film data subset.
Figure 13:
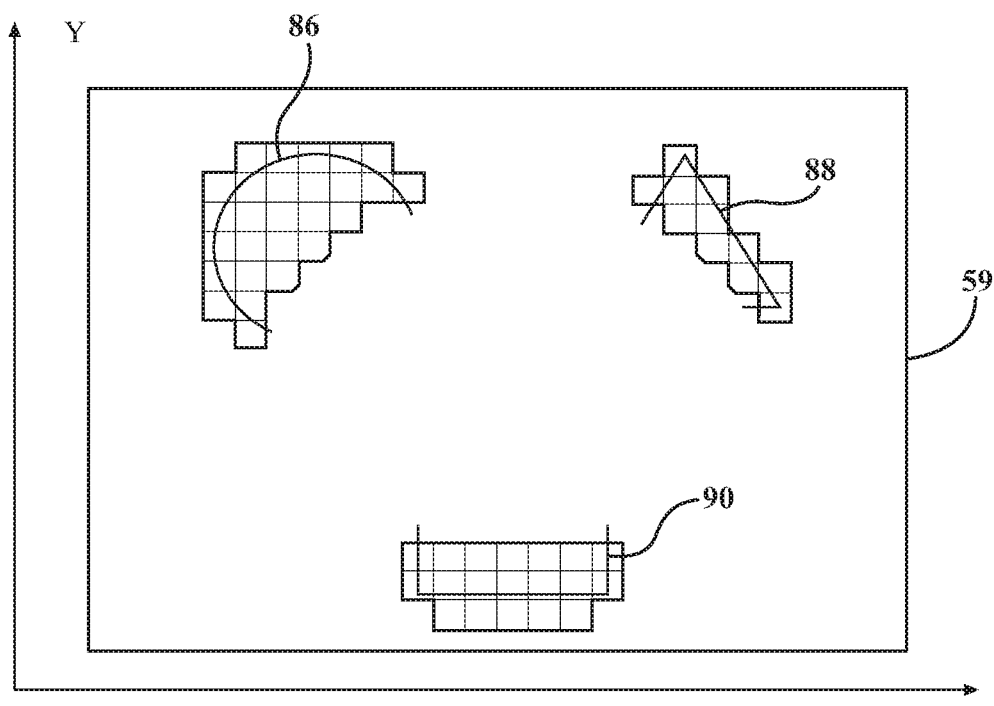
FIG. 13 is a modified object bitmap data set of FIG. 12 following the subtraction of the bitmap data subset from the object layer data set.

Step 1014 may be carried out on flexible film data subsets comprising bitmaps as well. This process is illustrated in FIGS. 12 and 13. In FIG. 12 the flexible film data subset is bitmap 61 or B(i). The object layer data set M(j) comprises bitmaps for objects 80, 82, and 84. The flexible film data subset bitmap B(i) pixels 61 are removed. Any pixels in the objects 80, 82, and 84 which overlapped with pixels from the flexible film data subset bitmap B(i) pixels are removed from the object layer data set M(j). The resulting modified flexible film data subset in the form of modified bitmap B'(i) is shown in FIG. 13 with subset bitmaps 86, 88, and 90 comprising B'(i). For each layer, this subtraction process is repeated for each flexible film data set 1 to K.

Figure 14:
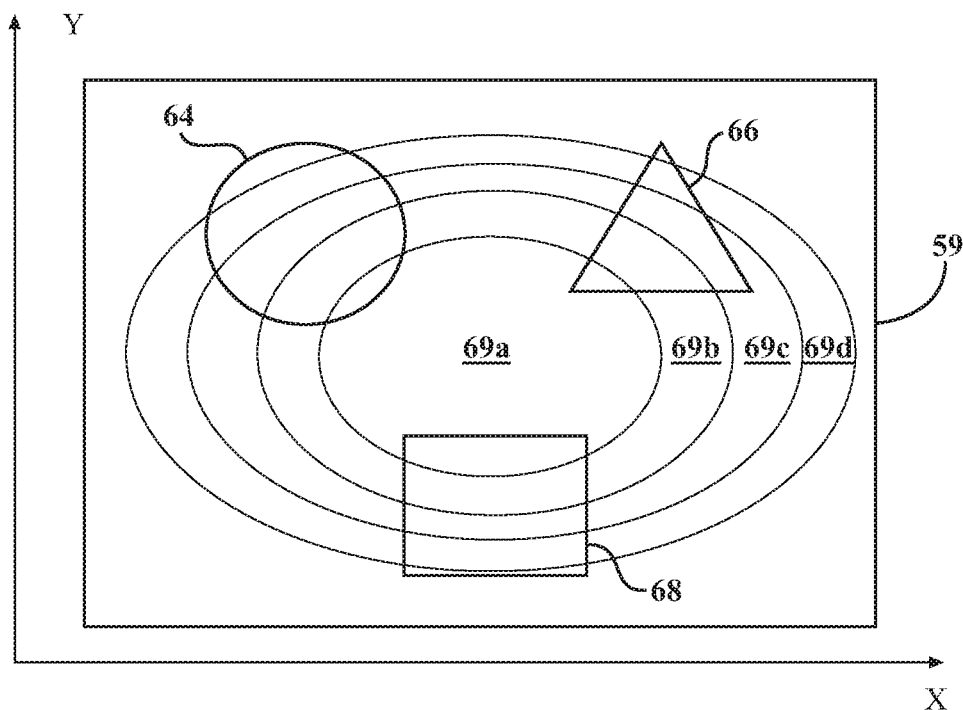
FIG. 14 is a graphical depiction of an object layer data set for a particular layer mapped onto four (4) deformable, flexible film data subsets, each corresponding to a particular build (z) axis location.
Figure 15A:
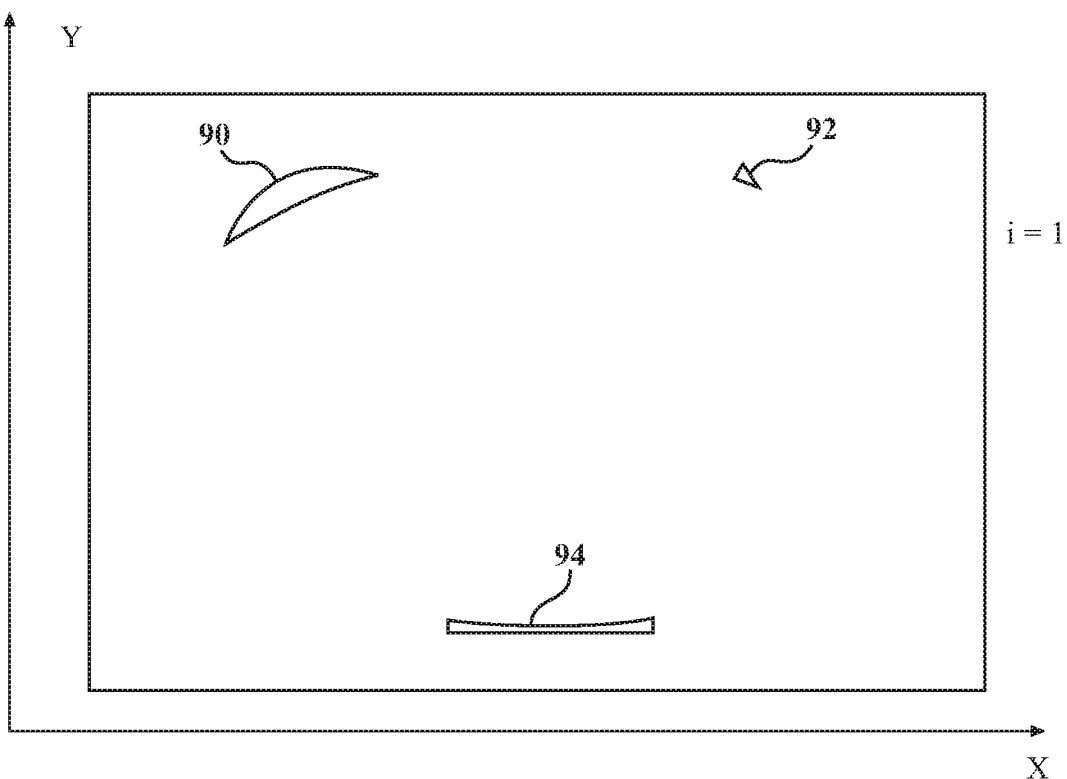
FIG. 15A is a graphical depiction of the subtraction from the object layer data set of FIG. 14 of the first outermost deformable, flexible film data subset to generate a first modified flexible film data subset.

FIGS. 14 and 15A-C illustrate the generation of modified flexible film data subsets for a single object layer in accordance with step 1014. Object layer data set M(j) includes objects 64, 66, and 68. Flexible film data subsets 69a-69d correspond to flexible film data subset indices i=1 to 4 (i.e., K=4). FIG. 15A illustrates the results of subtracting flexible film data subset 69d (i=1) from object layer data set M(j). The resulting modified flexible film data subset for i=1 includes members 90, 92, and 94. The flexible film data subset could be represented as contour data C'(1) or bitmap data B'(1).

Figure 15B:
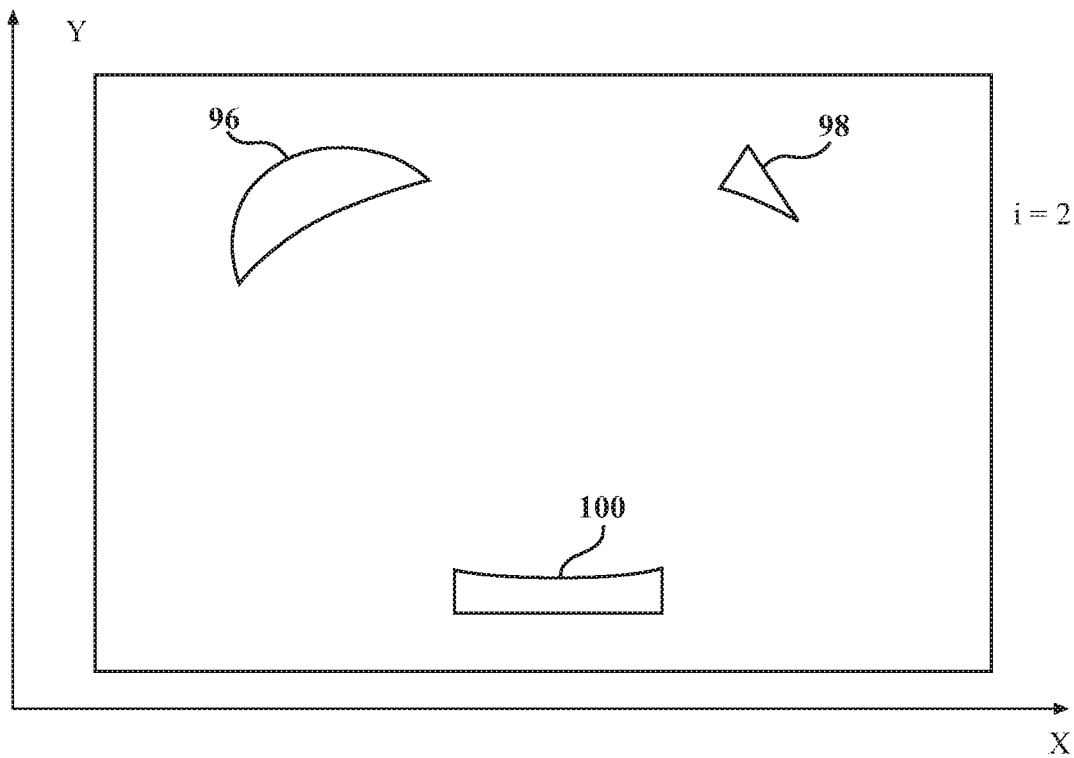
FIG. 15B is a graphical depiction of the subtraction from the object layer data set of FIG. 14 of the second outermost deformable flexible film data subset to generate a second modified flexible film data subset.
Figure 15C:
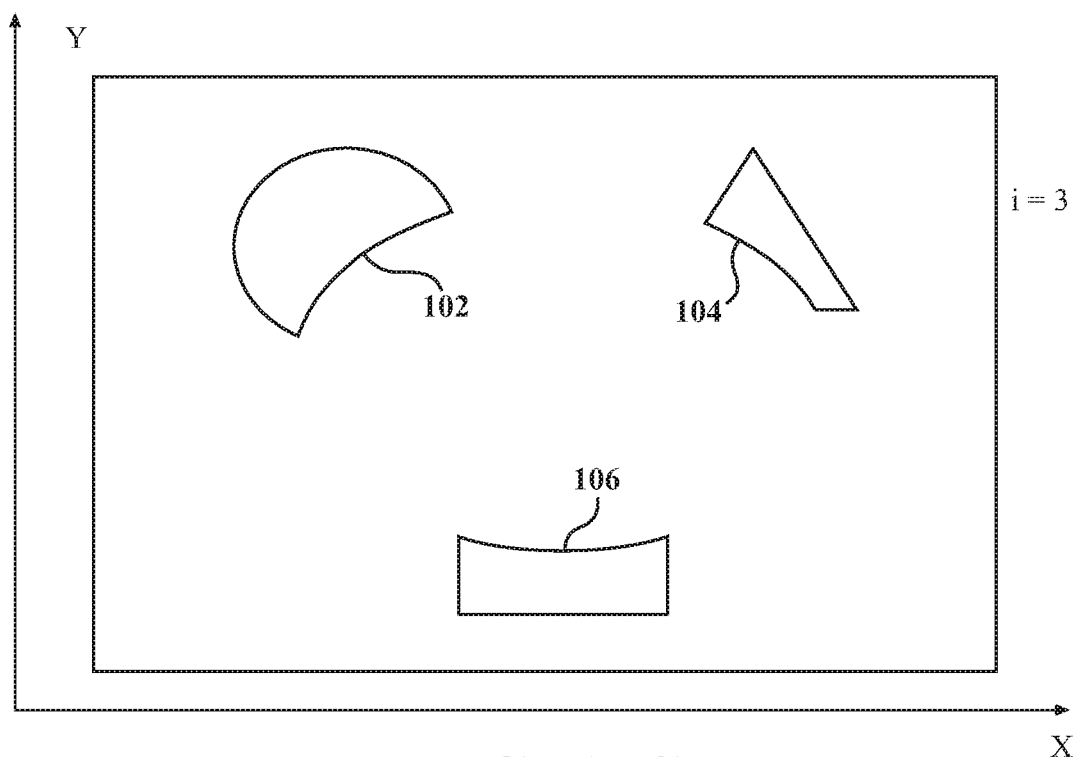
FIG. 15C is graphical depiction of the subtraction from the object layer data set of FIG. 14 of the third outermost deformable flexible film data subset to generate a third modified flexible film data subset.
Figure 15D:
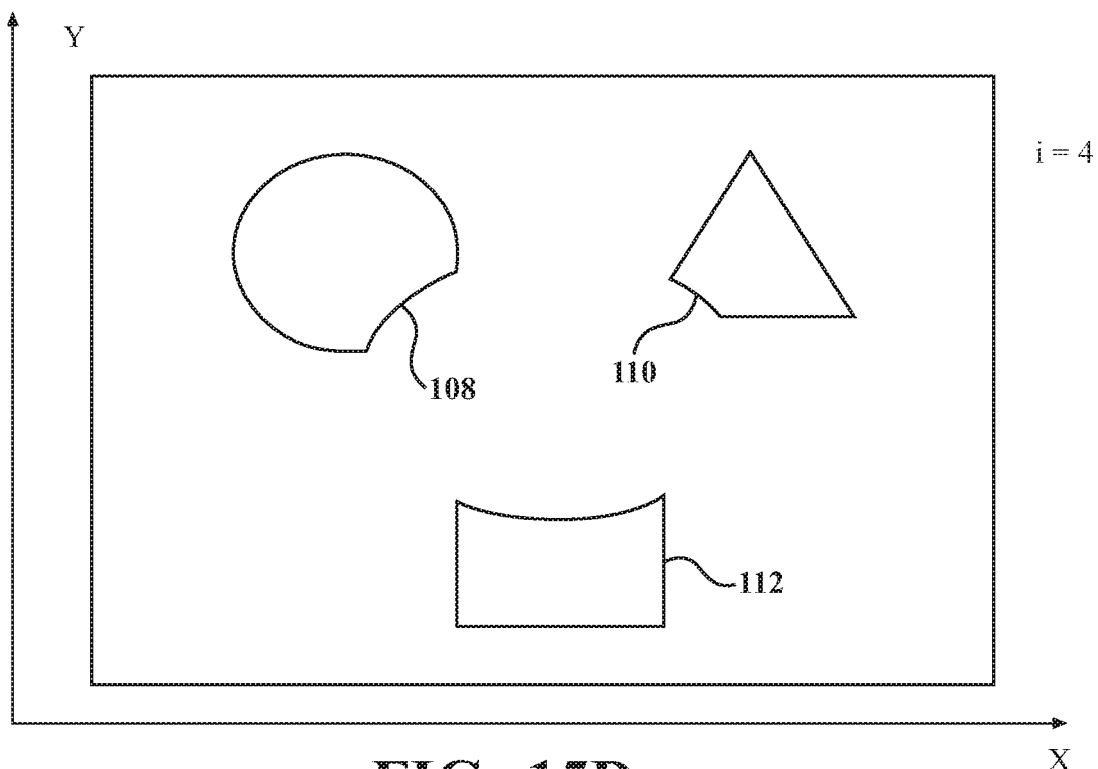
FIG. 15D is a graphical depiction of the subtraction from the object layer data set of FIG. 14 of the fourth outermost deformable flexible film data subset to generate a fourth modified flexible film data subset.

FIG. 15B illustrates the subtraction of flexible film data subset 69c (i=2) from object layer data set M(j) and includes subsets 96, 98, and 100. FIG. 15C illustrates the subtraction of flexible film data subset 69b (i=3) from object layer data set M(j) and includes members 102, 104, and 106. FIG. 15D illustrates the subtraction of flexible film data set 69a from object layer data set M(j) and includes members 108, 110, and 112.

Auxiliary data sets are generated in step 1016. Auxiliary data sets represent the difference between a modified flexible film data subset for a previous flexible film data subset index value i and a modified flexible film data subset for a current flexible film data subset index value i and may be represented as L(i). The auxiliary data subsets may take a variety of forms, including Cartesian coordinates and bitmaps. The first auxiliary data subset L1 is the first modified data subset i=1. Each object layer has 1 to K auxiliary data subsets. For each object layer, an additional auxiliary data subset with an index i equal to K+1 is also generated and is the intersection of the Kth flexible film data set and the current object layer data set.

Figure 15E:
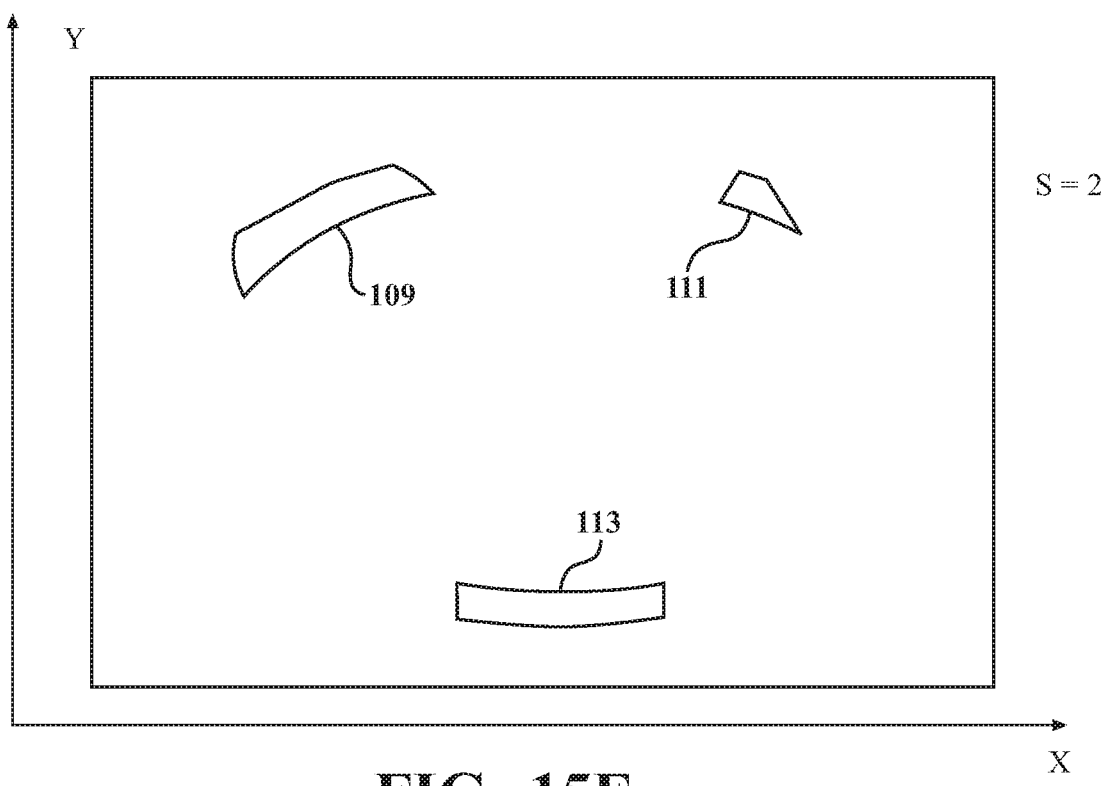
FIG. 15E is a graphical depiction of the subtraction from the second modified deformable data subset of FIG. 15B of the first modified deformable data subset of FIG. 15A to generate a second auxiliary data subset.
Figure 15F:
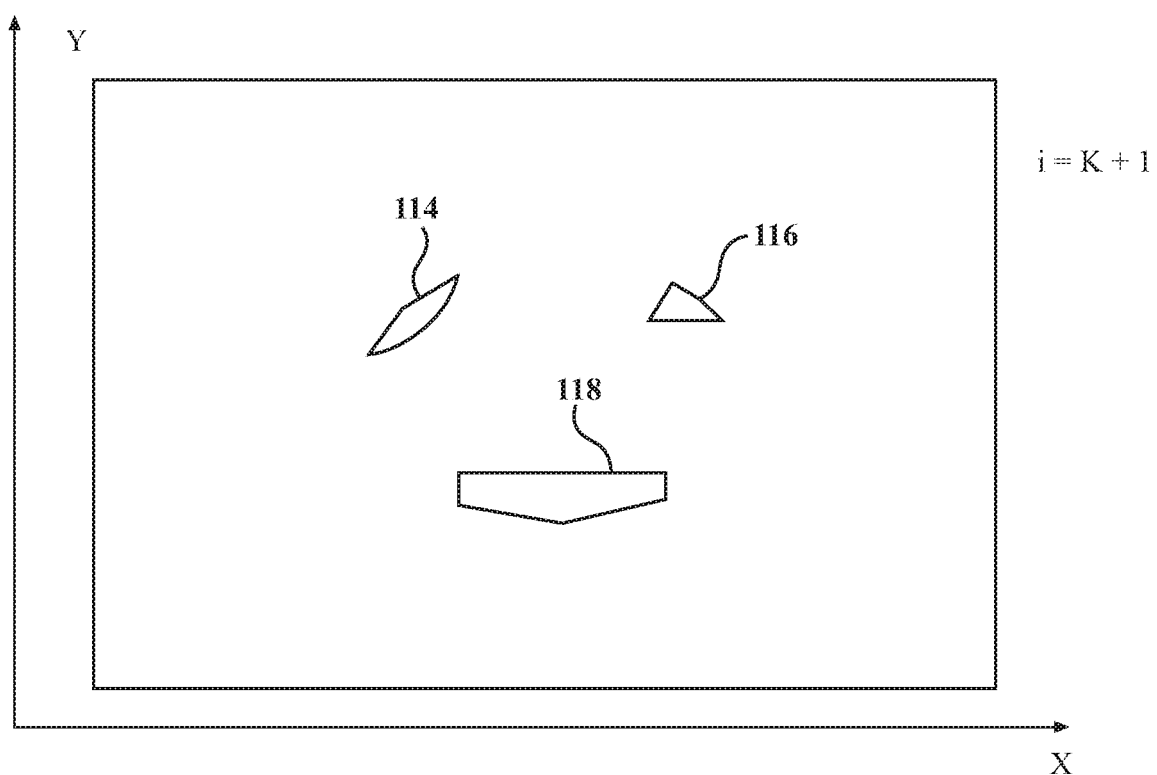
FIG. 15F is a graphical depiction of the intersection of the object layer data set of FIG. 14 with the innermost contour data set of FIG. 14 used to generate an auxiliary data subset with an index one unit higher than the number of contours.

The generation of an auxiliary data subset L(2) is illustrated in FIG. 15E. L(2) is the result of subtracting from the modified data subset for i=2 the modified data subset for i=1. The auxiliary data subset L(2) includes regions 109, 111, and 113. The generation of an auxiliary data subset for i=K+1 is illustrated in FIG. 15F, which is the overlap between the flexible film data subset for i=K and the object layer data set M(j). The result is auxiliary data subset L(5) which includes members 114, 116, and 118.

In step 1018 modified object layer data sets are generated based on the auxiliary data sets. The modified object layer data sets may be represented as M'(1) to M'(n+K) where n is the total number of layers and K is the total number of flexible film data sets. Thus, 1 to n+K represent new layer index values used with modified object layer data sets. There are three domains for determining values of M': M'(1) to M'(K), M'(K+1) to M'(n), and M'(n+1) to M'(n+K).

when the modified object layer index value p ranges from 1 to K:

$$M'(p)=\text{SUM}[(L(s)[M(j)]] \text{ for } s=p \text{ to } 1; j=1 \text{ to } p; \qquad (1)$$

when the modified object layer index value ranges from K+1 to n:

$$M'(p)=\text{SUM}[L(s)[M(j)]] \text{ for } s=1 \text{ to } K+1; j=p \text{ to } p-K; \qquad (2)$$

when the modified object layer index value ranges from n+1 to n+K:

$$M'(p)=\text{SUM}[L(s)[M(j)]] \text{ for } s=p-n+1 \text{ to } K+1; j=n \text{ to } p-K; \qquad (3)$$

wherein, p=modified object layer data index for layer p (dimensionless);
j=object layer data index for layer j (dimensionless);
s=auxiliary data subset index (dimensionless);
K=maximum flexible film layer index (dimensionless);
n=maximum object layer index (dimensionless).

In step 1020 solidification energy patterns corresponding to the modified object layer data sets are projected into a photohardenable material as build platform 26 continually moves upward.

Figure 17:
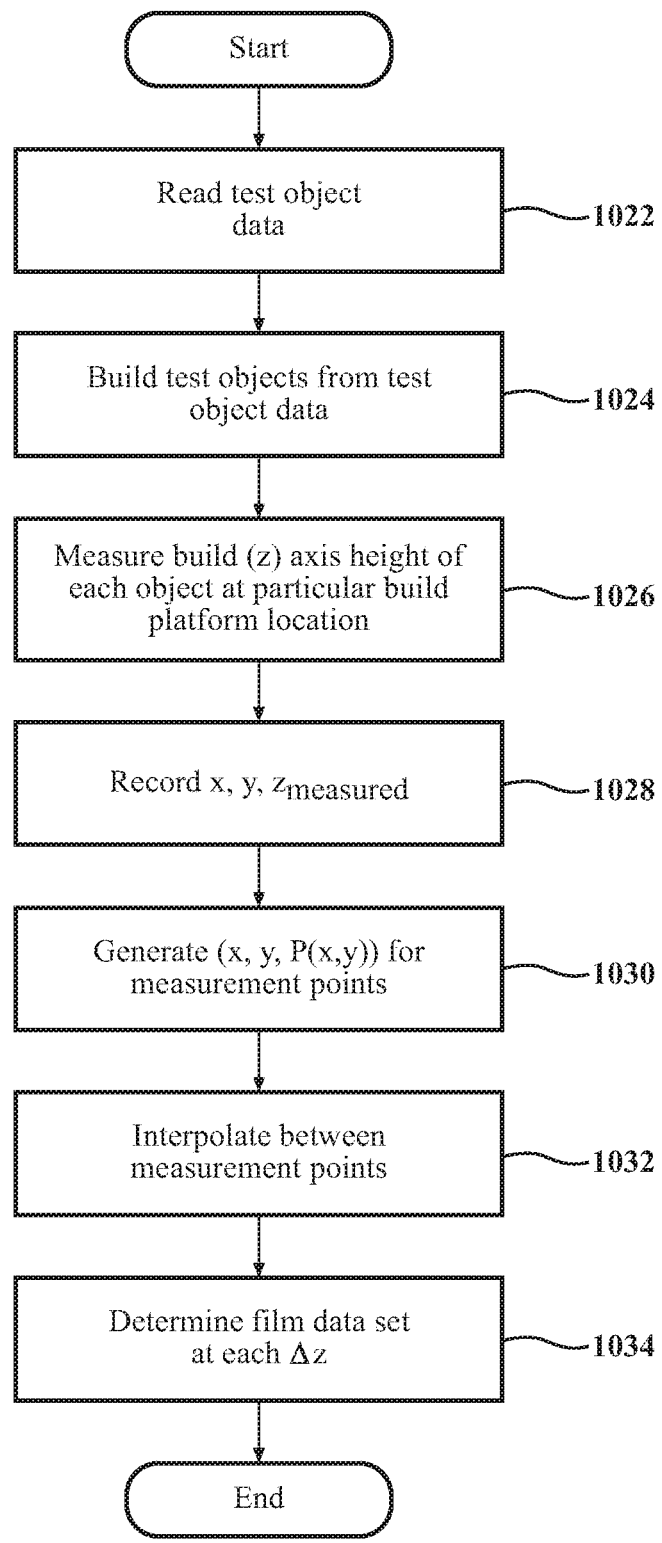
FIG. 17 is a flow chart depicting a method of generating a plurality of layer data sets for a deformable, flexible inhibitor-permeable film.

As indicated above, the methods described herein involve the use of a data representation of the flexible film data subsets. FIG. 17 describes a method of generating flexible film data subsets. A plurality of test objects are made without compensating the object data, and height measurements at fixed x, y locations are taken and used to create a function P(x,y) that is then used to create flexible film data sets. An example of such test objects is provided in FIG. 4. As shown in the figure, the central object 50*i* has the smallest height because it is the at the x, y location of the greatest film deformation.

In step 1022 test object data is read. Test object data is CAD, STL, SLI, SLC data, etc. that defines a plurality of test objects located at different position in the x, y plane. The test objects are built by supplying photohardening energy to the photohardenable material in step 1024.

In step 1026 measurements are made of the build (z) axis height of each object at a particular build platform x, y location. The measured heights and corresponding x,y locations are recorded in step 1028. In step 1030 a function P(x,y)—which may be a continuous or discrete function—is generated which represents the height of the deformed film 33 along the build (z) axis at x, y locations. In certain examples, interpolation techniques are used to generate values of P(x,y) for x, y locations at which height measurements were not made. Step 1032.

A graphical depiction of P(x,y) is shown in FIG. 5. The function 52 has a peak value 54. Referring again to FIG. 17, in step 1034, a flexible film data subset is generated at each value of the flexible film subset index i. The generation of one such flexible film data subset is illustrated by the intersection of plane 56 with function 52. The locus of intersection 58 defines the flexible film data set for the illustrated build (z) axis position (which corresponds to an object layer index. As mentioned previously, the locus of intersection may be defined by Cartesian coordinates C(i) for the contour of the intersection or by a bitmap B(i).

EXAMPLE

The methods described herein will now be further illustrated with the following example.

Approximation of the Deformed Film Shape

The precision of measuring and approximating of the deformed shape defines the precision of compensation. At the end of the measuring process we get information about the shape of the film in digital form as precise as possible. The process consists of several steps:

1. We build several identical test blocks on a build platform. Information about the location of the blocks is known. Due to the film distortion effect, the blocks have different heights. The number of blocks on the platform is chosen in order to achieve density big enough for approximation within desired precision. In FIG. 4 nine (9) blocks are built on platform 26. The block in the center 50*i* has the lowest height, while blocks on the corners 50*a*, 50*c*, 50*e*, and 50*g* have the highest heights. The exact locations of blocks in this case are taken uniformly. The method is not restricted to the use of only nine (9) blocks. Moreover, the blocks 50*a*-50*i* can be distributed in arbitrary way. However, uniform distribution allows us to achieve a uniform density, but this is not required. In general, the method can be applied for an arbitrary number of blocks distributed on the platform. The density and positions of the block distribution will affect the precision of the deformed flexible film shape approximation. The optimal way is to distribute the blocks uniformly. The more blocks we place on platform—the more information we get for approximating the deformed flexible film shape, and the more precise will be the flexible film shape approximation. However, as the number of blocks increases, so do the number of numerical computations that must be performed in the software. Therefore, in this example, the optimal distribution achieves a good approximation of the deformed film shape with the least number of blocks. Uniform distribution of the blocks in this example is optimal.

2. The second step is to measure each block 50*a*-50*i* with a caliper or by using a 3D scanner. However, as it can be easily seen in FIG. 4, the top of each block is not flat but instead has a curved shape. For approximating of the deformed film shape, we physically measure the height of a corner point of a block, for instance—left bottom corner of each block. It can be any corner. What is important is to measure the height of a specific point with known coordinates of the block. Corner points are the most optimal choice for several reasons: we know the x and y coordinates of each corner, it is physically simpler to measure a corner point.

3. By doing step 2 we get a set of input data for the deformed film shape approximation in the form:

$(x1, y1, z1)$ $(x2, y2, z2)$

...

$(xN, yN, zN)$, where x and y are coordinates of the corner point and z is a measured height.

4. During this step we want to use the input data in the form described in step 3 which was obtained during step 2. At the end we want to get an approximation of the deformed flexible film shape, i.e. we want to be able to compute the (x,y,z) coordinates of any point on the flexible film surface. The input data is our starting point. The input data is already the known x, y, z coordinates of N points on the deformed flexible film surface, but for compensation, we want to know the coordinates of any point. This problem is known as an interpolation problem in mathematics and computer science. There are many methods of solving this problem. Different interpolation techniques provide different levels of accuracy. In this specific example, we use interpolation by generating a 2nd degree polynomial with N=9 input points. Let us define polynomial P(x,y):

$$P(x,y) = a1*x + a2*y + a3*x*y + a4*x^2 + a5*y^2 + a6*x^2*y + a7*x*y^2 + a8*x^2*y^2 + a9; \quad (3)$$

Define a system of linear equations:

$$P(xi, yi) = zi; i \in [1;9] \quad (5)$$

where, i is an index that corresponds to a particular coordinate pair (x, y) and which ranges in value from 1 to 9.

A numerical method may be used to solve the system of linear equations (5) and find coefficients a1, a2, . . . , a9. Many suitable numerical methods exist, including direct methods such as Gaussian elimination. Where the number of input data points is relatively larger, for instance N=100, it is better to choose an indirect, iterative method, one example of which is the Jacobi method. Thus, once coefficients a1 . . . a9 have been determined, equation (4) is used to define coordinates of any point on deformed film 33 surface. The coordinates will be $$(x,y,P(x,y)) \qquad (6)$$

Discretization of the Deformed Flexible Film Surface

As indicated above, the deformed flexible film shape is approximated using the function P(x,y). This function 52 defines a 2D surface in 3D space as depicted in FIG. 5. The next step is a discretization of the flexible film 33 surface. In accordance with this example, the method of making a three-dimensional object uses sliced data. Therefore, we will slice the deformed flexible film 33 surface (FIG. 5) also. Each point on the surface has coordinates given by coordinates (6), where P is given by equation (4). The intersection of the deformed flexible film surface 52 with a plane 56 (see FIG. 5) gives a slice, a cross section of the deformed flexible film, which can be defined by a contour. In general we want to find isolines or surface levels of the deformed film shape. This is a well known problem in mathematics and computer science. In the method of compensation described herein, any of the existing techniques for finding isolines may be used.

Any digital representation of isolines may be applied. Two such exemplary representations of the slices of the deformed flexible film surface are the bitmap form and the contour form. The methods of deformed flexible film compensation described herein may use both. We start from the method of obtaining a contour form of the flexible film 33 shape discretization. In this case we have to transfer the flexible film surface approximation (6) into the discrete sets of contour data.

Contour Discretization of Flexible Film Surface

In accordance with this example, system 20 of FIG. 1A is used. Pattern generator 37 is a digital light projector (DLP) that projects an image of given resolution, for instance 1920×1080. That means that an image consists of pixel matrix with 1920 columns and 1080 rows. This matrix has 1920×1080=2.073.600 pixels. The flexible film compensation uses the parameters from the DLP for discretization. FIG. 6 shows a rectangle 59 that represents the size of build platform 26, and the contour line 58 is the result of the intersection of the plane 56 (FIG. 5) with deformed flexible film surface 52. We introduce the following parameters dx, dy defined in the following way. If resolution of projector in X direction is Rx, resolution of projector in X direction is Ry, and if the size of the build platform in X direction is Bx, and in Y direction is By, then $$dx=Bx/Rx \text{ is a size of a pixel in } X \text{ direction, and} \qquad (4)$$

$$dy=By/Ry \text{ is a size of } s \text{ pixel in } Y \text{ direction.} \qquad (5)$$

For example, if the resolution of the DLP is 1920×1080 and platform size is 92.1×51.7 mm then, Rx=1920, Ry=1080, Bx=92.1, By=51.7, and dx=92.1/1920=0.04796875 mm, dy=51.7/1080=0.04787037 mm.

The next step is to generate a flexible film data set comprising contours (C1, C2, . . . , CK) which consists of K contours. Each contour C is a flexible film data subset and consists of finite number of contour points. The total number of contours K is equal to a number slices of the deformed flexible film surface. Thus total number of contours K can be defined in the following way:

1. We identify a parameter which is called a deformed film height H along the build (z) axis. The deformed film height is a height of the maximum of the deformed flexible film surface. As it can be seen in FIG. 5 this is a height of the central point 54. In this example, the deformed flexible film height is a difference between maximum of the measured heights of the blocks 50a-50i in FIG. 4 and a measured height of the center block in FIG. 4. As it can be seen from FIG. 4, this difference between the lowest and a highest block is the deformed flexible film height.

2. Let dZ be a voxel (volumetric pixel) depth, i.e. a layer thickness from the process being used to make a three-dimensional object.

3. Define K=H/dZ

Start from contour C1 and compute all contour points in C1, then repeat this procedure for C2, C3, etc, until reaching CK, and thus generate a complete set of contours (C1, . . . , CK) which will be a contour representation of deformed flexible film surface discretization.

1. Set current Z height to be equal to the dZ, intersection of plane z=dZ with the deformed flexible film surface
2. Generate contour points according to the following algorithm:
   a. Start from x=b1 in FIG. 6
   b. Search an intersection of vertical line with the flexible film surface
   c. If there are points of intersections depicted as dots in FIG. 6, then we add them to the contour line (line running through the film).
   d. If there are no points of intersection, then we skip this line
   e. Set next x by adding distance between vertical lines dx, where dx is defined by DLP parameters, see (4).
   f. If x>bM, the right end of platform, then we stop the process, if x<=bM, then we repeat steps b-f.
3. Set next z by adding dZ
4. If z>H then we stop the process, if z<=H, then we repeat steps 2-4.

By the end of this process we get a complete contour set (C1, . . . , CK). During this process for each contour C in (C1, . . . , CK) we get the contour points 60 as depicted in FIG. 6. They form contour lines as shown in FIG. 7. However as it can be seen the right and left part of contour in FIG. 7 have an appreciable approximation error. The vertical lines connecting the contour points at the two extremes of the x-axis are far away from actual lines of the flexible film surface with a crossing plane. Since this error affects accuracy of the flexible film compensation, the contour is refined. To do that the following refinement procedure is applied.

1. Choose a region of refinement 63 (FIG. 7).
2. Define a refinement factor RF. This parameter increases a density of vertical lines in algorithm described in step 2 in above paragraph. For instance, if we set RF=2, then we take dx'=dx/2, i.e. the new refined distance between vertical lines is two times smaller, and hence the number of vertical lines is two times bigger.
3. Repeat steps a-f for region of refinement 614. By this we add new contour points as in FIG. 7, which makes refined contour 67 more accurate.

Another approach for discretization of the flexible film is the generation of bitmaps. This approach is similar to the one described in the previous section, but the digital representation of the flexible film data set is different. Instead of getting a complete set of contours (C1, ..., CK), we get a complete set of bitmaps (B1, ..., BK), where bitmap B is an image with resolution (Rx×Ry).

The input data for bitmap discretization of the deformed flexible film is the same as input for contour discretization of the flexible film. The DLP parameters are also the same. We start generating bitmap B1 which corresponds to a first cross section of the flexible film surface with plane z=dZ, then B2, B3, etc., finishing with BK which corresponds to a last cross section of the deformed flexible film surface.

1. Start from z=dZ
2. Generate a bitmap with pixel size (dx, dy) for given z in the following way:
   a. Start from the first column 65 of pixels 59 in FIG. 8.
   b. Search a first pixel which intersects with the flexible film surface at this z level
   c. Search a last pixel which intersects with the flexible film surface at this z level
   d. Mark all pixels in the column between the first and last pixels
   e. Move to the next pixel column
   f. If this is a last pixel column then stop
   g. If this is not a last pixel column then repeat steps b-g
3. Set new z by adding dZ to the current z height.
4. If z>H, then stop, if z<=H, then repeat steps 2-4.

At the of this process we get a complete set of bitmaps (B1, ..., BK) where each bitmap B is a result of the method described by the steps a-g in the paragraph above, see FIG. 8.

Description of Compensation of the Deformable Film Shape

The result of discretization of the deformed flexible film shape is used for deformed flexible film compensation. The result of discretization of the flexible film shape is shown in FIG. 9. It shows different flexible film subsets 69a, 69b, 69c, 69d, 69e, 69f, and 69g, which collectively define a flexible film data set, such as a contour data set or a bitmap data set. In this example, each level of the flexible film data sets is compensated for in the actual build.

Method of Compensating a Deformation of Flexible Film in Continuous Digital Light Manufacturing Process We will use the parameters described in the previous section. K is a number of layers in the deformed flexible film discretization. The value of K depends on height H of the deformed flexible film (i.e., point 54 in FIG. 5). To start compensating a deformed flexible film we need the input data which was obtained according to the two methods described in the previous sections. Recall that they are:

1. Contour set (C1, ..., CK)
2. Bitmap set (B1, ..., BK)

In this example, both types of input data may be used. The method can be applied to any CAD model being printed on a system such as system 20 with a build platform 26 that moves continuously upward during some or all of the exposures of the photohardenable material to photohardening energy from DLP 37. The CAD model or set of CAD models are processed in order to be built on system 20. This processing includes slicing or bitmap generation. In both cases a CAD model or set of CAD models after processing can be represented as either number of object layer data sets, which may be contours or bitmaps: M1, ..., Mn, where n is a number of slices or bitmaps after processing CAD models. Consider a slice of CAD models at certain height depicted in FIG. 10. We can see a platform with 3 different parts 64, 66, and 68 placed on the platform 26. Then a set M from (M1, ..., Mn) can be either a contour set depicted in FIG. 10 or a bitmap set depicted in FIG. 12. Set M is generated by slicing software. For this exemplary method it does not matter by which algorithm a set M is generated.

The method consists of 3 parts:
1. Submethod of subtracting a discretized deformed flexible film set C or B from contour or bitmap set M.
2. Submethod of generating auxiliary contour or bitmap sets for flexible film discretization.
3. Description of the compensating a deformed flexible film shape for a whole stack of object layer contour or bitmap sets (M1, ..., Mn).

Submethod of Subtracting Deformed Flexible Film Subset Data from Object Layer Data Let us take a contour set C, it can be any contour set from (C1, ..., CK). Also let M be an object layer contour data set from FIG. 10. Object layer contour data set M consists of 3 contours—a contour of circle, a contour of triangle, and a contour of rectangle. Both, C and M, are shown in FIG. 10. This submethod consists of the following steps:

1. Take an object layer contour data subset Mi (i.e., any of the object layer data subsets defined by circle 64, triangle 66, or rectangle 68 from object layer contour set M).
2. Find intersection of Mi contour subset from contour set M with contour C. Define new contour points as result of intersection, see FIG. 10.
3. As used herein, a contour is said to be "outer" or "outside" if the contour is one that borders an area where no object exists which is external to the object. A contour is said to be "inner" or "inside" contour if it is an area where the object does not exist internal to the object, i.e., cavities, hollows, voids, etc. lying within the outer boundary of the object. If the contour is outer then define an updated (modified) contour by adding new points from step 2, adding the points of contour C which are inside contour Mi, and removing the contour points of contour Mi which are inside of the contour C. If the contour is inner then define an updated (modified) contour by removing contour points of contour C which are inside of contour Mi and removing contour points of contour Mi which are inside of contour C.
4. Move to the next object layer contour data subset Mi in contour set M.
5. If this was a last contour, then we stop, if not then repeat steps 2-5.

As result of this steps we get an updated or modified contour subset shown in FIG. 11.

Now let us see how the subtraction works on bitmaps. Consider a deformed flexible film bitmap B from bitmap set (B1, ..., BK). Also consider the object layer bitmap M of the parts 80, 82, and 84 from FIG. 12. Both, a flexible film bitmap B and the object bitmap M, are shown in FIG. 12. In short, subtract bitmap B from bitmap M. There are many methods of bitmap subtractions in computer science. All of them will work. The key is to subtract the flexible film data set from the parts. The following method is very simple, and consists of the following steps:

1. Take a pixel from bitmap B.
2. Compare the pixel with corresponding pixel from bitmap M. If both pixels are marked (i.e., overlap), the remove this pixel from bitmap M.

3. Move to the next pixel
4. If that was a last pixel, then stop. If not, repeat steps 2-4.

As result of the steps applied to bitmap B and M we get the updated bitmap shown in FIG. 13.

Submethod of Generating Auxiliary Sets

To use a method of deformed flexible film compensation we will generate auxiliary sets using the method of subtraction described in the previous section. The submethod described in this section will generate an auxiliary data set (L1, . . . , L(K+1)) from deformed flexible film discretization contour set (C1, . . . , CK) or bitmap set (B1, . . . , BK) for an arbitrary object layer data set M from (M1, . . . , Mn).

Consider an object layer contour or bitmap set M and a deformed flexible film contour set 69a-69g which may be represented as a contour data set (C1, . . . , CK) or bitmap set (B1, . . . , BK) as shown in FIG. 14. The figures in FIG. 14 are depicted by solid lines, but can be either a contour representation or bitmap representation. The submethod described in this section is the same.

At the first stage we generate an updated (modified) contour set (C'1, . . . , C'K) or updated (modified) bitmap set (B'1, . . . , B'K) for an object layer contour or bitmap set M by applying the submethod described in previous section:
1. Take a first contour set C or bitmap B
2. Apply a submethod described in the previous section to C or to B and get updated contour set C' or updated bitmap set B'
3. Take a next contour set C or bitmap B
4. If that was a last contour set C or bitmap B, then stop. If not then repeat steps 2-4.

As result we get an updated (modified) contour set (C'1, . . . , C'K) or updated (modified) bitmap set (B'1, . . . , B'K) as illustrated in FIGS. 15A-15D. Each figure shows a result of applying submethod of subtraction of the deformed flexible film shape C1, C2, C3, C4 in particular case K=4 from the parts 64, 66, and 68.

The last stage of generating auxiliary sets consists of subtracting updated sets from each other in a strictly defined order. At this stage it is important to recall that the order 1 to K corresponds to an order from the lowest flexible film discretized set to the highest, i.e. the CK or BK corresponds to the deformed flexible film height H, while C1 and B1 correspond to the lowest flexible film discretized set. We define auxiliary contour or bitmap set (L1, . . . , L(K+1)) in the following way:
1. Define L1 as C'1 or bitmap B'1.
2. Define L2 as result of subtraction from contour set C'2 or bitmap B'2 (FIG. 15B) a contour set C'1 or bitmap B'1 (FIG. 15A) by the submethod of subtraction described above. This step is depicted in FIG. 15E.
3. Define L3 as result of subtraction from contour set C'3 or bitmap B'3 a contour set C'2 or bitmap B'2 by the submethod of subtraction described above.
4. . . . .
5. Define LK as result of subtraction from contour set C'K or bitmap B'K a contour set C'(K−1) or bitmap B'(K−1).
6. Define L(K+1) as result of intersection of the contour set CK or bitmap BK with contour set or bitmap M (see FIG. 15F) by the method which can be obtained from the submethod of subtraction described above:

The method in the step 6 for contour data set is the following:
1. Take an object layer contour data subset Mi
2. Find intersection of Mi contour subset from contour set M with contour C. Define new contour points as result of intersection, see FIG. 10.
3. If contour is outer then define an intersection contour by adding new points from step 2, adding the points of contour C which are inside contour Mi, and removing the contour points of contour Mi which are outside of the contour C. If contour is inner then define an intersection contour by removing contour points of contour C which are inside of contour Mi, and adding contour points of contour Mi which are inside of contour C.
4. Move to the next object layer contour data subset Mi in contour set M.
5. If this was a last contour, then we stop, if not then repeat steps 2-5.

The method in the step 6 for bitmap data set is the following:
1. Take a pixel from bitmap B.
2. Compare the pixel with corresponding pixel from bitmap M. If both pixels are marked (i.e., overlap), the add this pixel to intersection bitmap.
3. Move to the next pixel
4. If that was a last pixel, then stop. If not, repeat steps 2-4.

Method of Deformed Flexible Film Compensation

The method of compensating for the distortion of the flexible film for object layer input data (M1, . . . , Mn) generates an updated (modified) set (M'1, . . . , M'(n+K)) of object layer contour sets or bitmaps. Note that the total number of data sets (n+K+1) is bigger than original number of data sets n. It is natural to assume that n>K, because otherwise the deformed flexible film height H is bigger than a height of the part, and hence it would be impossible to compensate.

On each step below for each object layer contour set or bitmap M we generate an updated (modified) contour set (C'1, . . . , C'K) or updated bitmaps (B'1, . . . , B'K) and auxiliary set (L1, . . . , L(K+1)). These sets are specifically generated for a given object layer's input contour set or bitmap M. In other words if M1 is different from M2, then an updated (modified) contour set (C' 1, . . . , C'K) or updated bitmaps (B' 1, . . . , B'K) and auxiliary set (L1, . . . , L(K+1)) for M1 is different from an updated contour set (C'1, . . . , C'K) or updated bitmaps (B'1, . . . , B'K) and auxiliary set (L1, . . . , L(K+1)) for M2. Thus on each step below the generated sets will be unique. To distinguish the sets we add one extra index in the brackets:

(C' 1, . . . , C'K)(M) denotes an updated (modified) contour set for object layer data set M (B' 1, . . . , B'K)(M) denotes an updated (modified) bitmap set for object layer data set M (L1, . . . , L(K+1))(M) denotes an auxiliary set for object layer data set M Any subset L(i) from auxiliary set (L1, . . . , L(K+1)) has both, contour and bitmap representations.

The modified object layer data set (M'1, . . . , M'(n+K)) is generated in ascending order. We start from layer 1, and will finish with layer (n+K):
1. Take a M1 as input, define M' 1 as L1(M1), i.e. M' 1=L1(M1).
2. Take M2 as input, define M'2 as an union of L1(M2) and L2(M1), i.e. M'2=L1(M2)+L2(M1)
3. Take M3 as input, define M'3 as an union of L1(M3), L2(M2), L3(M1), i.e. M'3=L1(M3)+L2(M2)+L3(M1)
4. . . . .
5. Take M(K+1) as input, define M'(K+1) as an union of L1(M(K+1)), L2(MK), L3(M(K−1)), . . . , L(K+1) (M1), i.e. M'(K+1)=L1(M(K+1))+ . . . +L(K+1)(M1)

6. Take M(K+2) as input, define M'(K+2) as an union of L1(M(K+2)), L2(M(K+1)), L3(MK), . . . , L(K+1)(M2), i.e. M'(K+2)=L1(M(K+2))+ . . . +L(K+1)(M2)

7. . . . .

8. Take M(n) as input, define M'(n) as an union of L1(M(n)), L2(M(n−1)), L3(M(n−2)), . . . , L(K+1)(M(n−K)), i.e. M'(n)=L1(M(n))+ . . . +L(K+1)(n−K)

9. Define M'(n+1) as a union of L2(Mn), L3(M(n−1)), L4(M(n−2)), . . . , L(K+1)(M(n−K+1)), i.e. M'(n+1)= L2(Mn)+ . . . +L(K+1)(M(n−K))

10. . . . .

11. Define M'(n+K) as an L(K+1)(M(n)), i.e. M'(n+K)=L(K+1)(M(n))

In each step, updated (modified) auxiliary data subsets having an index value i equal to the current layer index value j and the index values of previous layers are used. For instance, on layer 1, i.e. M1, data L1(M1) is used. On layer 2, i.e. M2, we data L1 from layer 2 and data L2 from layer 1, are used. The range of generated data (M'1, . . . , M'(n+K+1)) can be subdivided into 3 subranges:

1 . . . K
K+1 . . . n
n+1 . . . n+K

For each of three ranges, different ways of defining the modified object layer data sets M' are used. For a first range a generation of M' is described by steps 1-4 (above). For a second range a generation of M' is described by steps 5-7 (above). For a third range a generation of M' is described by steps 8-10 (above).

To illustrate the foregoing, consider example with K=4 and n=8.

| Index Range | Modified Object Layer Data Set |
|---|---|
| 1 to K | M'1 = L1(M1) |
| | M'2 = L1(M2) + L2(M1) |
| | M'3 = L1(M3) + L2(M2) + L3(M1) |
| | M'4 = L1(M4) + L2(M3) + L3(M2) + L4(M1) |
| K + 1 to n | M'5 = L1(M5) + L2(M4) + L3(M3) + L4(M2) + L5(M1) |
| | M'6 = L1(M6) + L2(M5) + L3(M4) + L4(M3) + L5(M2) |
| | M'7 = L1(M7) + L2(M6) + L3(M5) + L4(M4) + L5(M3) |
| | M'8 = L1(M8) + L2(M7) + L3(M6) + L4(M5) + L5(M4) |
| n + 1 to n + K | M'9 = L2(M8) + L3(M7) + L4(M6) + L5(M5) |
| | M'10 = L3(M8) + L4(M7) + L5(M6) |
| | M'11 = L4(M8) + L5(M7) |
| | M'12 = L5(M8) |

The modified object layer data sets M'1 to M'12 are then used to determine the patterns projected by the pattern generator 37, which in this example is a DLP.

The present invention has been described with reference to certain exemplary embodiments thereof. However, it will be readily apparent to those skilled in the art that it is possible to embody the invention in specific forms other than those of the exemplary embodiments described above. This may be done without departing from the spirit of the invention. The exemplary embodiments are merely illustrative and should not be considered restrictive in any way. The scope of the invention is defined by the appended claims and their r equivalents, rather than by the preceding description.

What is claimed is:

1. A method of making a three-dimensional object on a build platform that moves along a build axis, the three-dimensional object being defined by object data corresponding to the three-dimensional object, the method comprising:
   (a) admitting a photohardening inhibitor through a flexible film and into a volume of a photohardenable material such that the flexible film deforms;
   (b) modifying the three-dimensional object data to compensate for the deformation of the flexible film;
   (c) projecting photohardening energy through the flexible film and into the photohardenable material in accordance with the modified three-dimensional object data.

2. The method of claim 1, wherein the flexible film deforms along the build axis such that a central portion of the film extends along the build axis away from a peripheral portion of the film.

3. The method of claim 1, wherein the build platform moves along a build axis during the step of projecting photohardening energy through the flexible film and into the photohardenable material.

4. The method of claim 1, wherein the step of modifying the three-dimensional object data comprises modifying the three-dimensional object data using flexible film data sets representing the flexible film in a deformed state.

5. The method of claim 4, wherein each flexible film data set comprises a plurality of flexible film data subsets, and each flexible film data subset is defined by the intersection of a data representation of a plane parallel to a build axis and a data representation of the flexible film in a deformed state.

6. The method of claim 5, wherein each set of flexible film data comprises a set of Cartesian coordinates.

7. The method of claim 5, wherein each flexible film data subset comprises a bitmap.

8. The method of claim 4, wherein the object data defines a height of the three-dimensional object along the build axis and an object layer thickness along the build axis, and a total number of the flexible film data subsets is equal to the height of the three-dimensional object along the build axis divided by the layer thickness.

9. The method of claim 4, wherein the object comprises a plurality of layers, the object data comprises a plurality of object layer data sets, and each object layer data set corresponds to one of the layers.

10. The method of claim 9, further comprising generating modified flexible film data sets for each object layer, wherein each modified flexible film data set corresponds to one of the object layer data sets and one of the flexible film data sets.

11. The method of claim 10, further comprising generating an auxiliary data set for each layer, each auxiliary data set comprising a plurality of auxiliary data subsets, wherein the auxiliary data subset for a first value of a flexible film data subset index is the same as the modified flexible film data subset for the first value of the flexible film data subset index, and the auxiliary data subset for each subsequent value of the flexible film data subset index is based on the subtraction of the modified flexible film data subset for the subsequent flexible film subset index value and the modified flexible film data subset for the immediately preceding flexible film subset index value.

12. The method of claim 11, further comprising generating an additional auxiliary data subset based on the intersection of the flexible film data subset for the last flexible film subset index value and the object layer data subset for the last layer.

13. The method of claim 12, further comprising generating a modified object layer data set for each layer, wherein the modified object layer data set for each layer is represented as the vector [M'(1), . . . , M'(n+k)] having a modified object layer index value p ranging from 1 to (n+k), and the step of generating the modified object layer data set for each layer is performed as follows:

when the modified object layer index value p ranges from 1 to K:

$M'(p)=SUM[(L(s)[M(j)]]$ for $s=p$ to $1;j=1$ to $p$;

when the modified object layer index value p ranges from K+1 to n:

$M'(p)=SUM[L(s)[M(j)]]$ for $s=1$ to $K+1;j=p$ to $p-K$;

when the modified object layer index value p ranges from n+1 to n+K:

$M'(p)=SUM[L(s)[M(j)]]$ for $s=p-n+1$ to $K+1;j=n$ to $p-K$;

wherein, p=modified object layer data index for layer p (dimensionless);
j=object layer data index for layer j (dimensionless);
s=auxiliary data set index (dimensionless);
K=flexible film maximum layer index (dimensionless);
L(s)=auxiliary data subset
n=maximum object layer index (dimensionless).

14. The method of claim 1, wherein the flexible film is a fluoropolymer.

15. The method of claim 1, wherein the step of admitting a photohardening inhibitor through a flexible film and into a volume of a photohardenable material creates a dead zone adjacent the flexible film in the photohardenable material where no photohardening occurs.

16. A method of approximating a deformed shape of a flexible film that selectively permits the passage of photohardening inhibitor from a first side of the film to a second side of the film, wherein the second side of the film is in contact with a volume of a photohardenable material, the method comprising:
providing test object data sets for a plurality of test objects located at different positions in a first plane;
projecting photohardening energy through the flexible film and into the photohardenable material to solidify a plurality of test objects, each test object corresponding to one of the test object data sets and having a height along a build axis perpendicular to the plane;
measuring a height of each test object along the build axis, wherein each height corresponds to a position in the plane; and
determining a function relating a height of the deformed film along the build axis to a position in the plane from the measured object heights and corresponding positions in the plane.

17. The method of claim 16, wherein the step of determining a function relating a height of the deformed film along the build axis as to a position in the plane from the measured object heights and corresponding positions in the plane comprises interpolating between the points of measurement of each test object in the plane.

18. The method of claim 17, wherein the step of interpolating between the points of measurement of each test object in the plane comprises fitting the measured height and corresponding coordinates defining the corresponding positions in the plane for each test object to a second order polynomial.

19. A method of determining a plurality of sets of a selected one of contour data and bitmap data for a deformed flexible film a flexible film that selectively permits the passage of photohardening inhibitor from a first side of the film to a second side of the film, wherein the second side of the film is in contact with a volume of a photohardenable material, the method comprising:
approximating a deformed shape of the flexible film in accordance with the method of claim 16;
determining points of intersection between data representations of planes perpendicular to the build axis and the function relating the height of the deformed film along the build axis to position in the plane, wherein the points of intersection between each data representation of a plane and the function define a set of the selected one of contour data and bitmap data.

20. A method of modifying three-dimensional object layer data sets to account for the deformation of a flexible film that retains a volume of photohardenable material that is hardened to form a three-dimensional object along a build axis, wherein each object layer data set corresponds to a location along the build axis, and the method comprises:
generating a plurality of flexible film data subsets from a data representation of the flexible film, wherein each flexible film data subset corresponds to a location along the build axis;
generating a modified object layer data set for each layer based on the corresponding object layer data set for the layer and each of the flexible film data subsets in the plurality of flexible film data sets, wherein each flexible film data subset corresponds to a location along the build axis.

21. The method of claim 20, wherein the step of generating a modified object layer data set for each layer comprises subtracting object layer data for the corresponding layer from each flexible film data subset in the plurality of flexible film data subsets to generate a modified flexible film data set for each object layer.

22. The method of claim 21, wherein the step of generating a modified object layer data set for each layer comprises subtracting the modified flexible film data set for a value of the flexible film subset index from the modified flexible film data set for the immediately previous flexible film subset index.

23. The method of claim 22, wherein each auxiliary data set for the layers in the plurality of the layers comprises a plurality of auxiliary data subsets and corresponds to a flexible film data subset.

24. The method of claim 22, wherein each modified object layer data set for each layer corresponds to at least one auxiliary data subset that corresponds to an object layer data subset for a preceding layer.

25. The method of claim 22, wherein each modified object layer data set in a plurality of modified object layer data sets corresponds to a sum of auxiliary data subsets, each auxiliary data subset corresponding to one of the flexible film data subsets and one of the object layer data subsets.

26. The method of claim 20, wherein each flexible film data subset comprises a set of Cartesian coordinates.

27. The method of claim 20, wherein each flexible film data subset comprises a bitmap.

28. A method of making a three-dimensional object, comprising:
modifying three-dimensional object data to account for the deformation of a flexible film in accordance with claim 20;
projecting a plurality of photohardening energy patterns through the deformed flexible film and into the photohardenable material when the build platform is at different positions along the build axis, thereby hardening the photohardenable material into a plurality of object layers, each object layer corresponding to one of the photohardening energy patterns, and each photohardening energy pattern corresponding to one of the modified object data sets.

29. The method of claim 28, further comprising:
supplying a photohardening inhibitor through the deformed flexible film and into the photohardenable material.

30. The method of claim 29, wherein the step of supplying a photohardening inhibitor creates a dead zone in which photohardening does not occur in the photohardenable material adjacent the deformed flexible film.

31. The method of claim 29, wherein the photohardening inhibitor is a gas.

32. The method of claim 29, wherein the gas is oxygen.

33. The method of claim 28, wherein the build platform moves along the build axis during the step of projecting a plurality of photohardening energy patterns.

34. The method of claim 28, wherein the photohardenable material is provided in a first reservoir comprising sidewalls and a bottom defined by the flexible film, and the flexible film is in fluid communication with a second reservoir containing a source of the photohardening inhibitor.

35. The method of claim 28, wherein the deformed flexible film comprises a fluoropolymer.

* * * * *